(12) United States Patent
Şaşioğlu et al.

(10) Patent No.: US 10,644,227 B2
(45) Date of Patent: May 5, 2020

(54) MAGNETIC TUNNEL DIODE AND MAGNETIC TUNNEL TRANSISTOR

(71) Applicant: Forschungszentrum Jülich GmbH, Jülich (DE)

(72) Inventors: Ersoy Şaşioğlu, Jülich (DE); Stefan Blügel, Aachen (DE)

(73) Assignee: Forschungszentrum Jülich GmbH (DE)

( * ) Notice: Subject to any disclaimer, the term of this patent is extended or adjusted under 35 U.S.C. 154(b) by 0 days.

(21) Appl. No.: 15/765,923

(22) PCT Filed: Oct. 28, 2016

(86) PCT No.: PCT/EP2016/076041
§ 371 (c)(1),
(2) Date: Apr. 4, 2018

(87) PCT Pub. No.: WO2017/076763
PCT Pub. Date: May 11, 2017

(65) Prior Publication Data
US 2018/0309047 A1    Oct. 25, 2018

(30) Foreign Application Priority Data
Nov. 3, 2015  (DE) .................. 10 2015 221 521

(51) Int. Cl.
*H01L 43/08*    (2006.01)
*H01L 29/66*    (2006.01)
(Continued)

(52) U.S. Cl.
CPC ......... *H01L 43/08* (2013.01); *H01F 10/3254* (2013.01); *H01F 10/3268* (2013.01);
(Continued)

(58) Field of Classification Search
None
See application file for complete search history.

(56) References Cited

U.S. PATENT DOCUMENTS 7,012,832 B1 * 3/2006 Sin .................... G11C 11/16
                                            365/158
7,259,437 B2    8/2007 Nguyen Van Dau
(Continued)

FOREIGN PATENT DOCUMENTS

DE    10141341 C2    8/2003
DE    60320191 T2    6/2009
EP     1548832 A1    6/2005

OTHER PUBLICATIONS

Wang, X. L. "Proposal for a New Class of Materials: Spin Gapless Semiconductors" Phys. Rev. Lett. 100 Apr. 18, 2008 pp. 156404-1-156404-4 (Year: 2008).*
(Continued)

*Primary Examiner* — Grant S Withers
(74) *Attorney, Agent, or Firm* — Barnes & Thornburg LLP

(57) ABSTRACT

The present disclosure concerns a magnetic tunnel diode and a magnetic tunnel transistor. The magnetic tunnel diode may include two terminals for connecting to an electrical circuit as well as a tunnel junction. The magnetic tunnel transistor may include three terminals for connecting to an electrical circuit as well as a layer arrangement.

14 Claims, 9 Drawing Sheets

(51) Int. Cl.
    *H01L 43/10*    (2006.01)
    *H01F 10/32*    (2006.01)
    *H01L 43/02*    (2006.01)
(52) U.S. Cl.
    CPC ........ *H01L 29/66984* (2013.01); *H01L 43/10* (2013.01); *H01L 43/02* (2013.01)

(56) References Cited

U.S. PATENT DOCUMENTS

| | | | |
|---|---|---|---|
| 8,233,249 | B2 | 7/2012 | Worledge |
| 8,269,293 | B2 | 9/2012 | Hong et al. |
| 2004/0207961 | A1* | 10/2004 | Ichimura ............... B82Y 10/00 360/324.2 |
| 2006/0183002 | A1* | 8/2006 | Yang ..................... B82Y 10/00 428/811 |
| 2008/0164547 | A1* | 7/2008 | Higo ..................... B82Y 10/00 257/421 |
| 2009/0121267 | A1 | 5/2009 | Hong et al. |
| 2010/0271112 | A1 | 10/2010 | Hong et al. |
| 2011/0042712 | A1 | 2/2011 | Wang |
| 2013/0248941 | A1 | 9/2013 | Inokuchi et al. |
| 2013/0277722 | A1 | 10/2013 | Hong et al. |

OTHER PUBLICATIONS

Wang, X. "Recent Advances in the Heusler based spin-gapless semiconductors" Journ. Mat. Chem. C 4 Aug. 14, 2016 pp. 7176-7192 (Year: 2016).*

Skaftouros, S. "Search for spin gapless semiconductors: the case of inverse Heusler compounds" App. Phys. Lett. 102 Jan. 14, 2013 pp. 022402-1-022402-2 (Year: 2013).*

Gao, Q. "First-principle study on some new spin-gapless semiconductors: The Zr-based quaternary Heusler alloys" Superlattices and Microstructures 85 Jun. 14, 2015 pp. 536-542 (Year: 2015).*

Saito, H. "Spin-polarized tunneling in metal-insulator-semiconductor Fe/ZnSe/Ga1—xMnxAs magnetic tunnel diodes" App. Phys. Lett . 89 Dec. 4, 2006 pp. 232502-1-232502-3 (Year: 2006).*

Choudhary, R. "Structural disorder and magnetism in the spin-gapless semiconductor CoFeCrAl" AIP Adv. 6, Mar. 4, 2016 pp. 056304-1-056304-5 (Year: 2016).*

Bainsla, L. "Spin gapless semiconducting behavior in equiatomic quaternary CoFeMnSi Heusler alloy" Phys. Rev. B 91 published Mar. 13, 2015 pp. 104408-1 through 104408-6 (Year: 2015).*

German Examination Report, Application No. 102015221521.0, dated Oct. 17, 2016, 2 pages.

International Search Report and Written Opinion, completed Jan. 13, 2017 and issued in connection with PCT/EP2016/076041, 13 pages.

Saito H et al: "Spin-polarized tunneling in fully epitaxial magnetic tunnel diodes with a narrow-gap In1—xMnAs electrode", Applied Physics Letters, vol. 95, No. 19, 192508, Nov. 13, 2009 (Nov. 13, 2009).

Nagahama, et al: "Hot electron transport in magnetic tunnel transistors with an epitaxial MgO tunnel barrier," Applied Physics Letter, vol. 96, 112509 (2010).

International Report on Patentability for International Application PCT/EP2016/076041, dated May 17, 2018, 14 pages.

* cited by examiner

MAGNETIC TUNNEL DIODE AND MAGNETIC TUNNEL TRANSISTOR

CROSS REFERENCE TO RELATED APPLICATIONS

This application is a national stage entry under 35 USC § 371 of PCT International Application No. PCT/EP2016/076041, filed Oct. 28, 2016, and claims the benefit under 35 USC § 119(e) to German Application 10 2015 221 521.0, filed Nov. 3, 2015.

FIELD OF THE DISCLOSURE

Field of the Disclosure

The present disclosure concerns a magnetic tunnel diode and a magnetic tunnel transistor as well as corresponding methods for its use.

Background

Quantum tunnel diodes and transistors, in particular hot carrier diodes and hot carrier transistors, are considered to be one of the most promising candidates for high-speed electronic devices. Operation frequencies of up to 30 THz have been demonstrated in metal-insulator-metal tunnel diodes, and several graphene-based vertical quantum tunnel transistors have been experimentally realized. It is appreciated here that quantum tunnel transistors have a great potential for high frequency, high-density high speed ICs—integrated circuits.

Exploiting the intrinsic spin magnetic moment of the electron in addition to its electronic charge has lead to the development of a new research field, called spintronics or spin electronics, which offers additional functionalities such as non-volatility, re-configurability, etc. The discovery of the giant magnetoresistance effect in spin valves and the tunnel magnetoresistance effect in magnetic tunnel junctions have inspired numerous sensor and memory applications.

SUMMARY

The present disclosure provides a magnetic tunnel diode and a magnetic tunnel transistor. In illustrative embodiments, the magnetic tunnel diode may include two terminals for connecting to an electrical circuit as well as a tunnel junction. In illustrative embodiments, the magnetic tunnel transistor may include three terminals for connecting to an electrical circuit as well as a layer arrangement.

BRIEF DESCRIPTIONS OF THE DRAWINGS

Figures 9A, 9B:
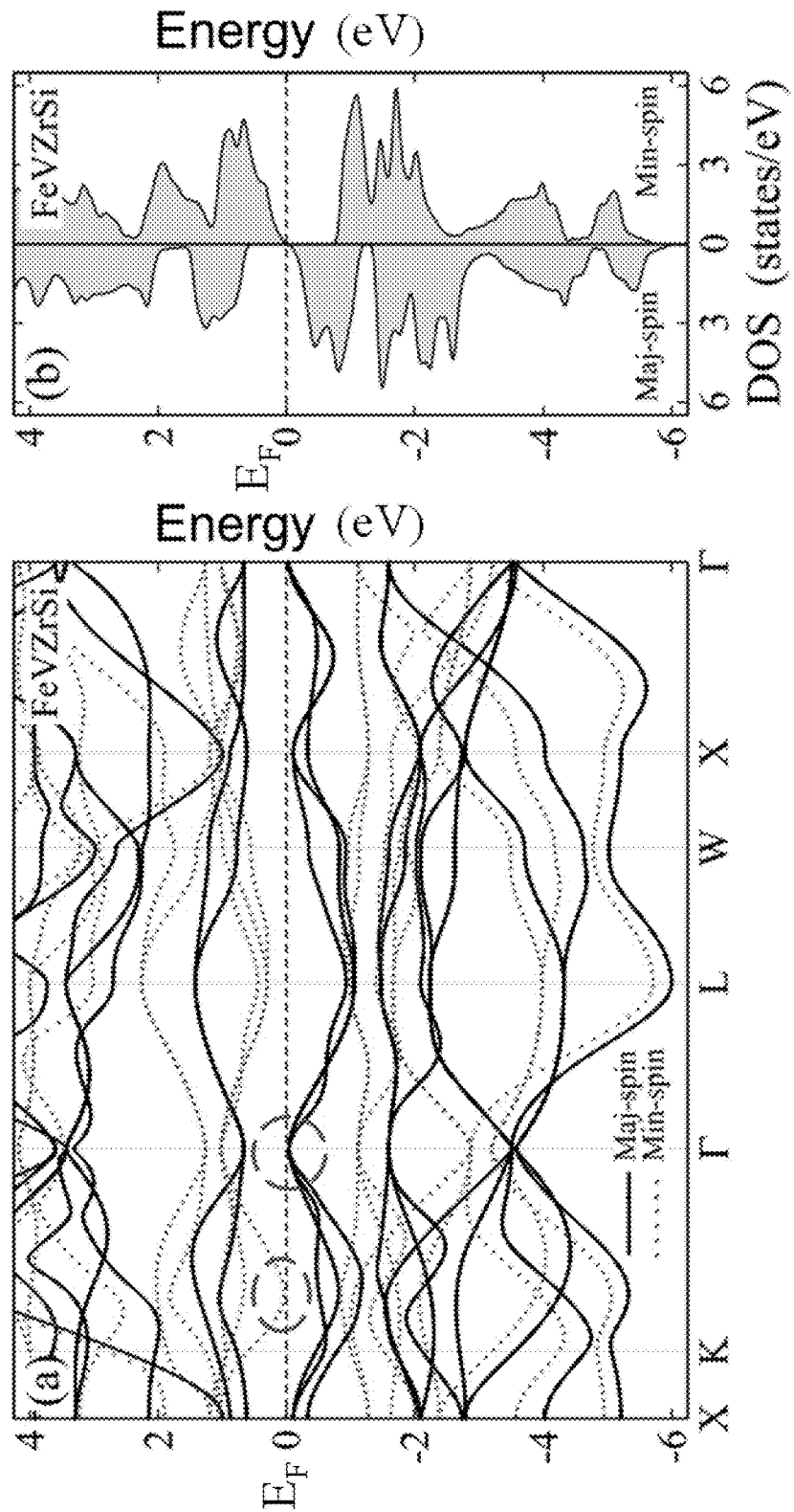

FIG. 9a is chart showing an electronic band structure of the spin gapless semiconductor of FeVZrSi of a magnetic tunnel diode according to the present disclosure or a magnetic tunnel transistor according to the present disclosure; and FIG. 9b is a chart showing density of states of the spin gapless semiconductor of FeVZrSi of a magnetic tunnel diode according to the present disclosure or a magnetic tunnel transistor according to the present disclosure.

DETAILED DESCRIPTION

Tunnel magnetoresistance is a magnetoresistive effect, which occurs in magnetic tunnel junctions. Usually, this is a component consisting of two ferromagnets, which are separated by a thin insulator. If the insulating layer is thin enough, typically several nanometers, then electrons are able to tunnel between both of the ferromagnets. By means of an external magnetic filed, the direction of magnetization of both of the magnetic layers can be controlled independent from each other. When the magnetizations are equally aligned, a probability for electrons to tunnel though the insulating layer is higher than at opposite, i.e. antiparallel, alignment. Thereby, the electric resistance of the junction can be switched back and forth between two different states of resistance—thus binary 0 and 1.

The large magnetoresistance that is obtained in these components have motivated the great research effort on developing variety of spintronic devices, such as magnetic tunnel diodes, magnetic RAM, magnetic tunnel transistors, spin field-effect transistors etc. Diode effect and magnetoresistance have been already observed for single asymmetric magnetic tunnel barriers, however with limited low rectification ratios.

On the other hand, double tunnel junctions with two tunnel barriers of different transparency are expected to exhibit highly asymmetric conduction depending on the polarity bias, i.e. it acts as a diode or current rectifier. Such a diode effect has been observed in double tunnel junctions, however with vanishing magnetoresistance. A strong diode effect and high magnetoresistance is also known in asymmetric metal/oxide double tunnel junctions.

In order to obtain asymmetric current-voltage (I-V) characteristics in magnetic tunnel diodes, it is necessary to use double tunnel barriers with different heights. This leads however to large threshold voltages $V_{th}$ and limited currents. Due to these main drawbacks, magnetic tunnel diodes are unsuitable for low power device applications.

Magnetic tunnel diodes are two-terminal devices that constitute the basic building blocks of the three-terminal magnetic tunnel transistors. These are based either on metal-insulator-metal-semiconductor or metal-insulator-metal-insulator-metal structures. The operation principles of these devices are similar and only the collection mechanisms differ depending on the nature of the barriers used.

The transfer rate a, which is defined as the ratio between the collector and emitter current ($I_c/I_e$), is an important index to evaluate the performance of magnetic tunnel transistors. Magnetic tunnel transistors with low transfer rate a and low magnetocurrent ratio are known. However in recent experiments of fully epitaxial magnetic tunnel transistors, moderate transfer rates α and magnetocurrent ratios are detected. This was attributed to the coherent tunneling and the single-crystalline base layer (T. Nagahama et al., Appl. Phys. Lett. 96, 112509, 2010). Large base-collector leakage currents and unsatisfactory transfer rates makes the magnetic tunnel transistors unsuitable for device applications.

Conventional hot carrier tunnel transistors and other magnetic and non-magnetic tunnel transistors usually reveal low transfer rates α due to thick tunnel barriers and high operation currents, wherein a reduction of the tunnel barrier thickness would lead to increase leakage currents.

Magnetic tunnel diodes and transistors have additional functionalities over their charge-based counterparts such as the use of magnetic electrodes: They allow the control and non-volatile programming of the current-voltage (I-V) characteristics. However, despite this functionality, these devices cannot be dynamically reconfigured. This means that rectification properties of magnetic tunnel diodes and asymmetric current-voltage characteristics of magnetic tunnel transistors cannot be altered after manufacturing.

A magnetic tunnel diode allows the current to pass only in one direction, but not in the other direction. In this respect, recently a charge-based reconfigurable metal-silicone-metal nanowire transistor was experimentally realized. This new transistor is a four-terminal device and it merges the electrical properties of unipolar n- and p-type field-effect transistors (FETs) into a single-type of device. It can be dynamically reconfigured to operate as p- or n-FET as programmed by application of an electric signal through the control gate. Besides transistor functions of the device, it can also be used as a reconfigurable diode by applying voltages to the control and program gates with different signs. However, the main drawback of this reconfigurable four-terminal transistor, or diode respectively, is the extra programming gate or gates, respectively, which increases the complexity of the device and limits the scalability. It also lacks the non-volatile functionality of magnetic tunnel transistors or magnetic tunnel diodes, respectively, since it is a charge-based transistor or diode, respectively. Furthermore the presence of an extra gate or gates, respectively, leads to more leakage currents and thus increases the power consumption.

A spin transistor is known from the document U.S. Pat. No. 8,269,293 B2. The document U.S. Pat. No. 7,259,437 B2 discloses a high performance spin valve transistor. A magnetic tunnel transistor is known from document U.S. Pat. No. 8,233,249 B2. The document US 2004/0207961 A1 discloses a magnetic resistance device and ferromagnetic layers, which comprise no spin gapless semiconductor.

The above described issues and the lack of combinability of the properties non-volatility and reconfigurability of tunnel diodes and tunnel transistors thus limit the technological advancement in nanoelectronic devices.

The afore-mentioned features known from the state of the art can be combined alone or in arbitrary combination with one of the below described objects according to the present disclosure.

The problem of the present disclosure is therefore to provide a correspondingly further developed magnetic tunnel diode and magnetic tunnel transistor as well as methods for the configuration.

The problem may be solved by devices and methods in accordance with the present disclosure, including as described in the claims.

A magnetic tunnel diode in accordance with the present disclosure may include two terminals, in particular exactly two terminals, for connecting to an electrical circuit as well as a tunnel junction having a material layer of a half metallic magnet, of a tunnel barrier, and a material layer of a spin gapless semiconductor.

Material layer "of" means material layer "comprising" or "consisting of".

In this application, magnet or magnetic covers permanent magnetic material as well as ferromagnetic or ferrimagnetic material. This also comprises for example a ferromagnet in a state without magnetic effect due to the absence of an external magnetic filed.

Half metallic magnet can be read as a semi-metallic, magnetic material.

Figure 1A:
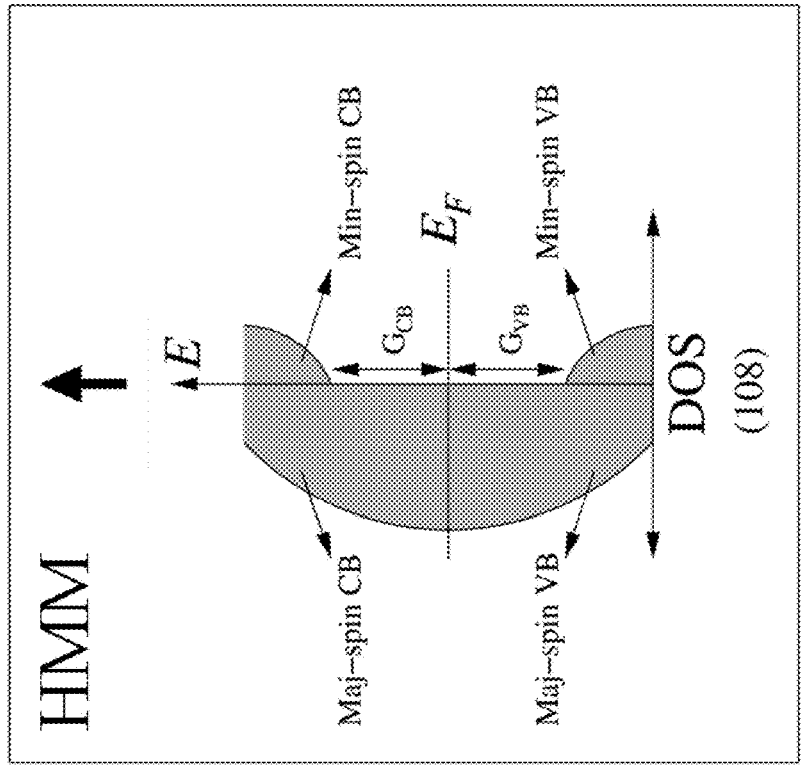
FIG. 1a is a schematic representation of the density of states (DOS) of the electrons in a half metallic magnet (HMM)
Figure 1B:
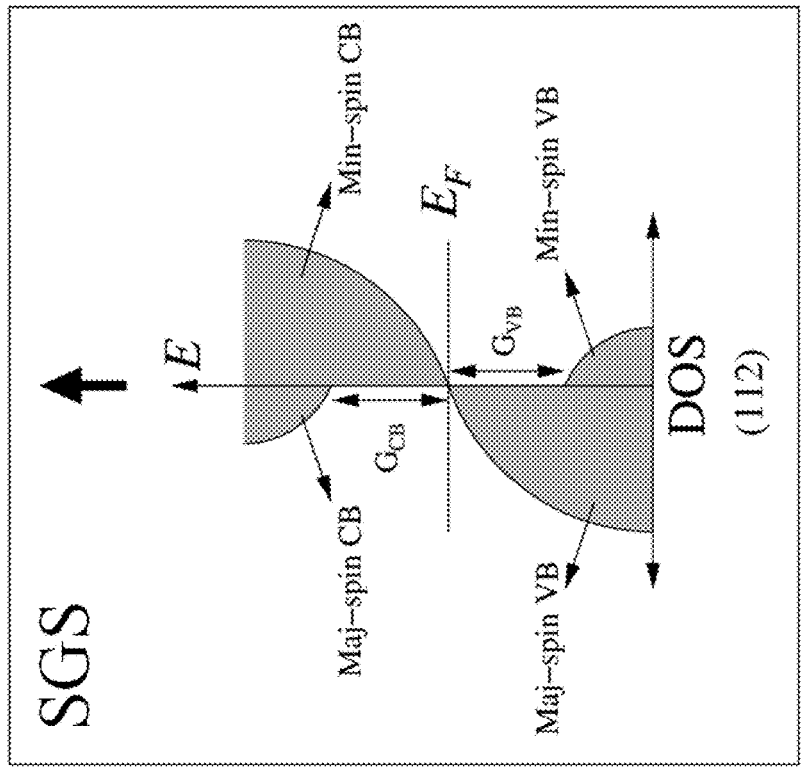
FIG. 1b is a schematic representation of the density of states (DOS) of the electrons in a spin gapless semiconductor (SGS)

Spin gapless semiconductor (semiconductor without any spin excitation gap) can be understood as a material or substance having semiconductor properties or as a semiconductor material, which does not have a spin excitation gap between the valence band and the conduction band, wherein no spin excitation gap may also be the case when in the range of the fermi energy a majority spin valence band runs over into a minority spin conduction band or a minority spin valence band runs over into a majority spin conduction band in the range of the fermi energy (see FIG. 1b). In spin gapless semiconductors, there is a band gap of the majority spin electrons above the fermi energy and a band gap of the minority spin electrons below the fermi energy—or vice versa. A spin gapless semiconductor material is described in the document US 20110042712 A1. On the other hand, there is an excitation gap if an excitation gap is either between the majority spin valence band and the majority spin conduction band, and/or the minority spin valence band and the minority spin conduction band (see FIG. 1a).

A further aspect of the present disclosure concerns a magnetic tunnel transistor comprising three terminals, in particular exactly three terminals, for connecting to an electrical circuit as well as a layer arrangement, in particular having the tunnel junction of the above-described magnetic tunnel diode, comprising an emitter half metallic magnetic layer, an emitter-base tunnel barrier, a spin gapless semiconductor layer, a base-collector tunnel barrier and a collector half metallic magnetic layer.

The magnetic tunnel diode according to the present disclosure and the magnetic tunnel resistor according to the present disclosure allow to achieve both properties, non-volatility and re-configurability, by the use of half metallic magnetic materials and a spin gapless semiconductor material.

Non-volatility means that input and output signal information do not get lost when the current is switched off, so that for example applications in the area of storage media become possible.

Reconfigurable means that the output signal function can be spontaneously defined also during operation, so that for example applications in the area of computer processors become possible.

Devices based on reconfigurable magnetic tunnel diodes and transistors offer many advantages including high operation speed (in the THz regime), low power consumption, simple circuit structure, etc. For instance, a device, which can be controlled by sending instructions to each gate while the device is in operation, allows program specific reconfiguration.

The added advantage of non-volatility enables combining logic and memory function on a single chip and thus generally eliminates the need for accessing external memory.

By the use of a half metallic magnetic layer (HMM) and a spin gapless semiconductor layer (SGS) being separated thereof by a tunnel barrier, an improved asymmetric current-voltage (I-V) characteristics can be achieved, i.e. a barely asymmetric current-voltage curve and a threshold voltage $V_{th}$ can be tuned particularly simple by varying the thickness and the potential height of the tunnel barrier.

Furthermore, a large current compared to conventional tunnel diodes can be provided, which enables the use of the device with low power.

By the use of the spin gapless semiconductor materials in a tunnel diode or a tunnel transistor, a variety of devices can be provided with low power under high-speed or high frequency, wherein in particular the obtainable TMR effect allows to come advantageously into effect for the realization of magnetic logic applications. Because all logical functions can be thereby implemented using only two magnetic tunnel diodes thanks to the inverse TMR effect. Existing magnetic tunnel junctions are usually unsuitable for economic implementation into a device due to the strong voltage dependency and low TMR values. It is worth to note that not all logical functions can be implemented by diode logic alone and only the non-inverting logical "AND" and logical "OR" functions can be realized by semiconductor diode gates. To implement all logic gates, around twenty conventional metal-oxide semiconductor field-effect transistors (MOSFET) were required, whereas only two magnetic tunnel diodes according to the present disclosure are sufficient. Reduced manufacturing expenditures for corresponding devices and saving of waver dies is thereby enabled.

Furthermore, semiconductor-based integrated logic gate arrays are usually after manufacturing not any more reconfigurable and in addition commonly non-volatile, because inputs and outputs information get lost after power shutdown. In contrast to that, logic gates, thus logic arrays, are non-volatile when using the magnetic tunnel diodes according to the present disclosure and therefore allow saving information independent from the energy supply. Furthermore, a reconfigurability is enabled also after manufacturing, i.e. the output function can be also during the running operation be redefined. Finally, it is possible to use certain parts as logic circuit and others as memory.

The magnetic tunnel transistor according to the present disclosure has symmetric transistor functions similarly to conventional metal-oxide semiconductor field-effect transistors (MOSFET). However, the magnetic tunnel transistor according to the present disclosure has the advantages of non-volatile and re-configurable compared to a MOSFET and furthermore allows to be operated also at high frequencies up to the THz regime, while at the same time having lower power consumption Devices based on the magnetic tunnel diodes and tunnel transistors according to the present disclosure enable high operation frequencies, low energy consumption and simple circuit structures so that for example logic components can be controlled by sending of commands in order to for example switch a gate while the component can realize program specific reconfigurations during operations.

Thanks to the non-volatility and reconfigurability, it is enabled that logic and memory can be combined on the same chip and therefore external memory becomes unnecessary.

In one embodiment of the magnetic tunnel diode according to the present disclosure, the material layer of the half metallic magnet has a fixed—i.e. determined or fixated—magnetization direction and the material layer of the spin gapless semiconductor has a reconfigurable magnetization direction. However, in the tunnel diode according to the present disclosure, also the reversed case is possible, namely that the material layer of the half metallic magnet has a reconfigurable magnetization direction and the material layer of the spin gapless semiconductor has a fixed magnetization direction.

A particularly simple reconfigurability as well as a flexible use of the tunnel diode can thereby be made possible.

In one embodiment of the magnetic tunnel diode according to the present disclosure, a fixation layer, which is adjacent to the tunnel junction—thus either to the material layer of the half metallic magnet or the material layer of the spin gapless semiconductor —, for fixing the magnetization direction either of the material layer of the half metallic magnet, when the fixation layer is adjacent to the half metallic magnet, or of the material layer of the spin gapless semiconductor, when the fixation layer is adjacent to the spin gapless semiconductor. A reliable fixation of the magnetization direction can thereby be achieved.

In one embodiment of the magnetic tunnel diode according to the present disclosure, a layer thickness of the material layer of the spin gapless semiconductor of at least 1 nm, preferably 2 nm, and/or at most 40 nm, preferably at most 20 nm, particularly preferred at most 8 nm, is provided.

A reliable diode function and also transistor function when integrating the diode in a transistor can thereby be enabled and at the same time reproducible manufacturing can be assured.

In one embodiment of the magnetic tunnel transistor according to the present disclosure, the layer arrangement has exactly the layer order as following:

Firstly, the emitter half metallic magnet layer; secondly, the emitter base tunnel barrier; thirdly, the half spin gapless semiconductor layer; fourthly, the base-collector tunnel barrier; fifthly, the collector half metallic magnet layer. A particularly reliable reconfiguration can thereby be achieved.

A further aspect of the present disclosure concerns a method for configuring and/or reconfiguring a current passing direction of a magnetic tunnel diode—in particular according to the present disclosure—and/or of a magnetic tunnel transistor—in particular according to the present disclosure —, wherein in order to reverse the magnetization direction of the spin gapless semiconductor of the tunnel diode, of the half metallic magnet of the tunnel diode and/or of the spin gapless semiconductor layer of the tunnel transistor, a current (with a current) greater than the operating current is applied or an external magnetic field is activated.

Current passing direction of the tunnel diode means the forward direction (conducting direction) for current between two terminals, i.e. for example from a lower electrode to an upper electrode, or vice versa.

Current passing direction of the tunnel transistor means the forward direction (conducting direction) for current between an emitter and a collector, i.e. from the emitter half metallic magnet layer to the collector half metallic magnet layer, or vice versa.

In the tunnel diode, the current (I, FIG. 2) between both terminals or both electrodes, respectively, is meant. In the tunnel transistor, the current is meant to be the current ($I_B$, FIG. 6) between emitter and base and/or between collector and base ($I_E$, FIG. 6), wherein the increase of the current can be in particular obtained by a short-time increase of the respective voltage (V, $V_{CB}$ and/or $V_{BE}$) above the height of the normal operation voltage—in case of the voltage $V_{BE}$ usually in the switched-on state.

Thanks to the switching of the magnetization direction by induced current or by magnetic field, a particularly simple reconfiguration can be enabled.

A further aspect of the present disclosure concerns a use of a spin gapless semiconductor in a magnetic tunnel diode—in particular according to the present disclosure—or of a spin gapless semiconductor layer in a magnetic tunnel transistor—in particular according to the present disclosure—for obtaining the properties non-volatility and/or reconfigurability of a current passing direction.

Logic and/or memory operations or the combination of logic and memory operations can thereby be enabled.

A further aspect of the present disclosure concerns the use of a spin gapless semiconductor in a magnetic tunnel diode—in particular according to the present disclosure—or of a spin gapless semiconductor layer in a magnetic tunnel transistor—in particular according to the present disclosure—for obtaining an inverse tunnel magnetoresistance effect.

Inverse TMR effect means that the TMR changes the sign when the polarity of the applied voltage changes.

Logic components can thereby be provided particularly compact and with particularly little effort and energy consumption.

In particular, in this use, the material layer is of the half metallic magnet of the magnetic tunnel diode, the emitter half metallic magnet layer or the collector half metallic magnet layer of the magnetic tunnel transistor is of a ferromagnetic or ferrimagnetic material, like e.g. Co or Fe. Preferably, such a tunnel junction can have the structure SGS/MgO/Fe or SGS/MgO/Co.

A particularly simple realization of logic components can thus be enabled.

In the following, embodiment examples of the present disclosure are described in further detail based on figures. One or several features of the embodiment examples can be combined with the claimed object.

A further aspect of the present disclosure concerns a method, wherein the magnetic tunnel transistor according to the present disclosure is switched on, i.e. a current flow is let through, by applying a voltage between base and emitter ($V_{BE}$>0), and is switched off by reducing the voltage between base and emitter $V_{BE}$ to zero, wherein the voltage between base and collector $V_{CB}$ is basically greater than zero. A particularly simple switching on and off can thus be enabled.

present disclosurepresent disclosurepresent disclosurepresent disclosurepresent disclosure In a magnetic material the electronic density of states (DOS) splits between an up-spin band—also called majority-spin band—and a down-spin band—also called minority-spin band.

In half metallic magnets (HMMs), the majority-spin electrons show the behavior of metal in a limited energy interval around the Fermi energy $E_F$, while minority-spin electrons show semiconducting behavior due to the band gap $G_{CB}$ and $G_{VB}$ as shown in FIG. 1a, wherein $G_{VB}$ is the distance between Fermi energy and valence band, and $G_{CB}$ is the distance between Fermi energy and conduction band. This leads to the 100% spin polarization of the conduction electrons at the Fermi energy $E_F$.

As shown in FIG. 1b, the spin gapless semiconductors (SGS) used in the tunnel diodes and tunnel transistors according to the present disclosure have a unique band structure such that a spin gap of the majority-spin electrons is above the Fermi energy and the spin gap of the minority-spin electrons is below the Fermi energy—or vice versa—, leading to the 100% electron spin polarization of the valence band and conduction band in respectively opposite direction. This particular spin gapless semiconductor is also called semiconductor with indirect band gap.

Figure 4:
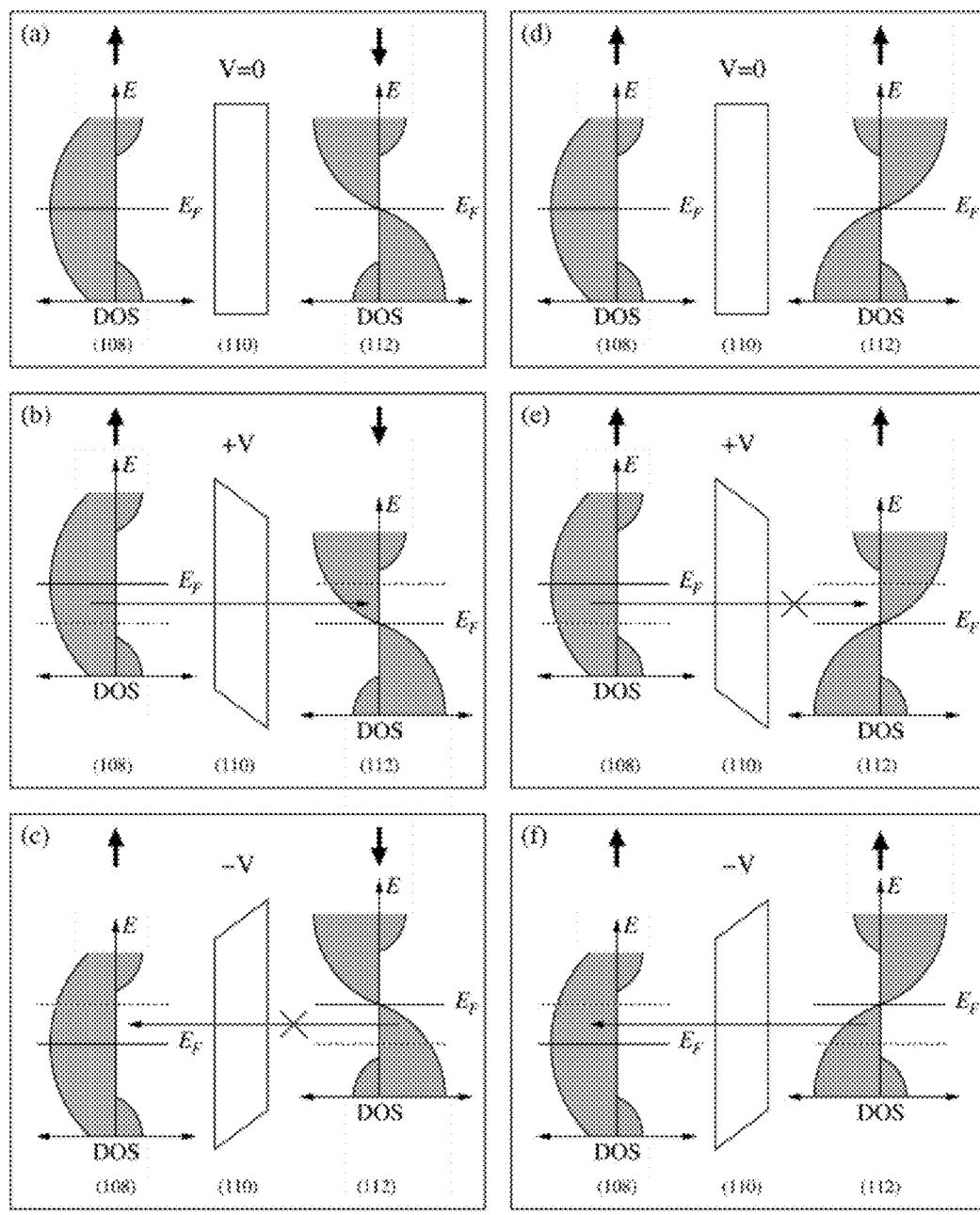
FIG. 4a is a schematic representation of the density of states (DOS) of the electrons in antiparallel configuration of the magnetic tunnel diode of FIG. 3a for a first bias voltage.
FIG. 4b is a second schematic representation of the density of states (DOS) of the electrons in antiparallel configuration of the magnetic tunnel diode of FIG. 3a for a second bias voltage.
FIG. 4c is a third schematic representation of the density of states (DOS) of the electrons in antiparallel configuration of the magnetic tunnel diode of FIG. 3a for a third bias voltage.
FIG. 4d is a schematic representation of the density of states (DOS) of the electrons in parallel configuration of the magnetic tunnel diode of FIG. 3b for a first bias voltage.
FIG. 4e is a second schematic representation of the density of states (DOS) of the electrons in parallel configuration of the magnetic tunnel diode of FIG. 3b for a second bias voltage.
FIG. 4f is a third schematic representation of the density of states (DOS) of the electrons in parallel configuration of the magnetic tunnel diode of FIG. 3b for a third bias voltage.
Figure 8:
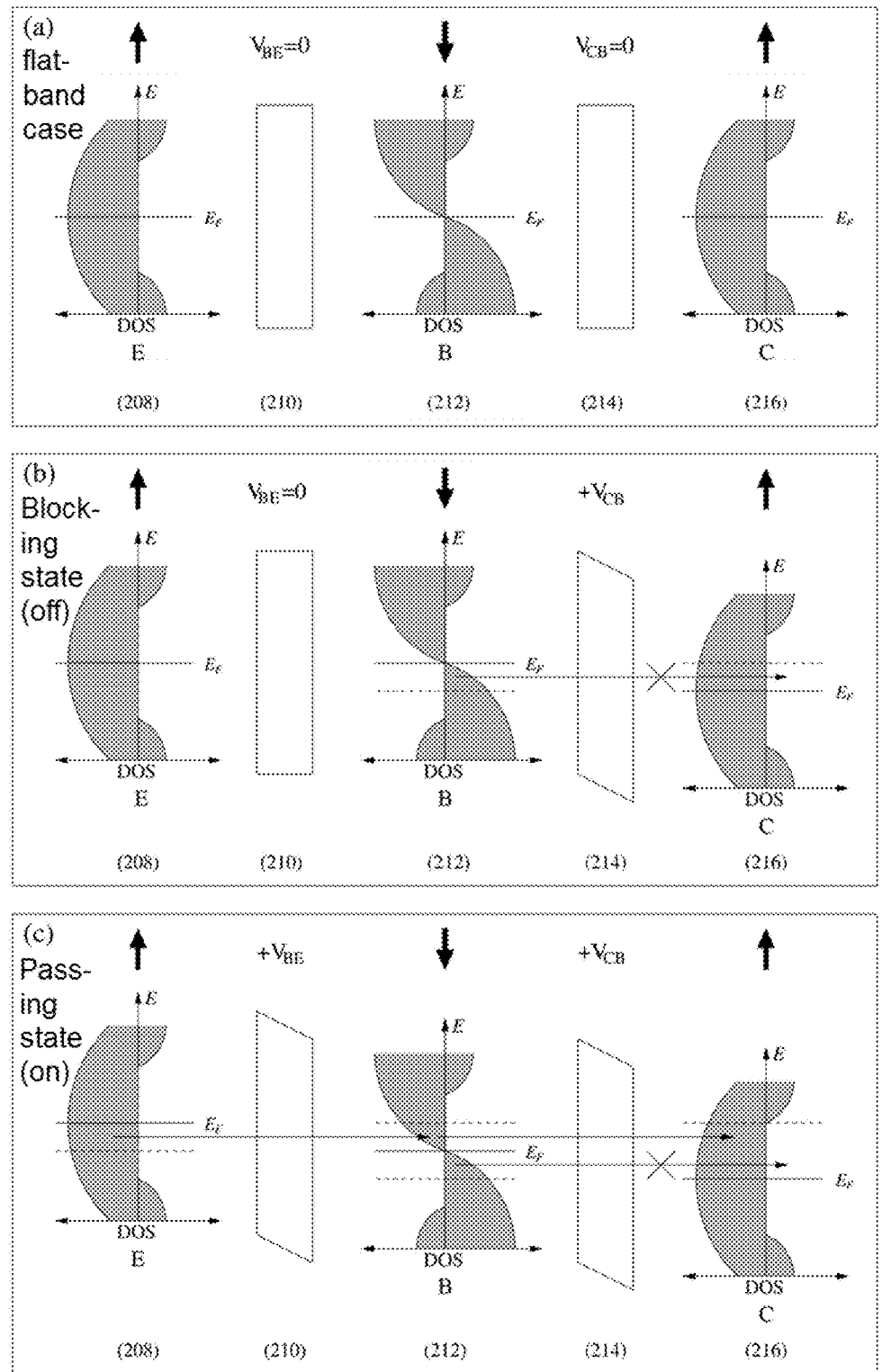
FIG. 8a is a schematic representation of the density of states (DOS) of the electrons of the reconfigurable magnetic tunnel transistor in a mode of operation associated with band alignment under flat-band condition with no external bias voltage.
FIG. 8b is a schematic representation of the density of states (DOS) of the electrons of the reconfigurable magnetic tunnel transistor in a mode of operation associated with the blocking-state with positive collector bias voltage.
FIG. 8c is a schematic representation of the density of states (DOS) of the electrons of the reconfigurable magnetic tunnel transistor in a mode of operation associated with the passing-state with both positive collector bias voltage and positive base bias voltage.

The FIGS. 1a and 1b as well as the FIGS. 4,8 and 9b can therefore be read in such a way that the majority-spin bands are shown on the left-hand side of the vertical axis and the minority-spin bands on the right-hand side. Furthermore, below the horizontally drawn-in Fermi energy $E_F$, the energy bands or valence bands, respectively, are generally occupied, while the energy bands or conduction bands above the fermentation energy $E_F$ are basically unoccupied and can therefore only serve as a transit station when a voltage is applied.

Thus, as f. ex. shown in FIG. 8c, an electron of the majority-spin band of the emitter E, which is arranged below the Fermi energy horizontal and thus occupied, can temporarily migrate to the unoccupied majority-spin band of the base above the Fermi energy horizontal in order to immediately reach the majority-spin band of the collector, which is also unoccupied, and from there flow off via the upper electrode 220.

Spin-resolved photoelectron spectroscopy (PES), also known as photo-emission spectroscopy, is a very powerful method of verifying a half metallic magnet, a spin gapless semiconductor or another magnetic material. This is because PES provides a direct way to identify the electronic structure of materials and therefore works generally reliable and provides more comprehensive information about the electronic structure of magnetic materials compared to indirect methods such as spin-polarized scanning tunneling microscopy or spin-polarized positron annihilation spectroscopy.

A diode is generally an electronic component with two terminals for passing an electrical current flow in only one direction and for blocking a current flow in the opposite direction.

Figure 2:
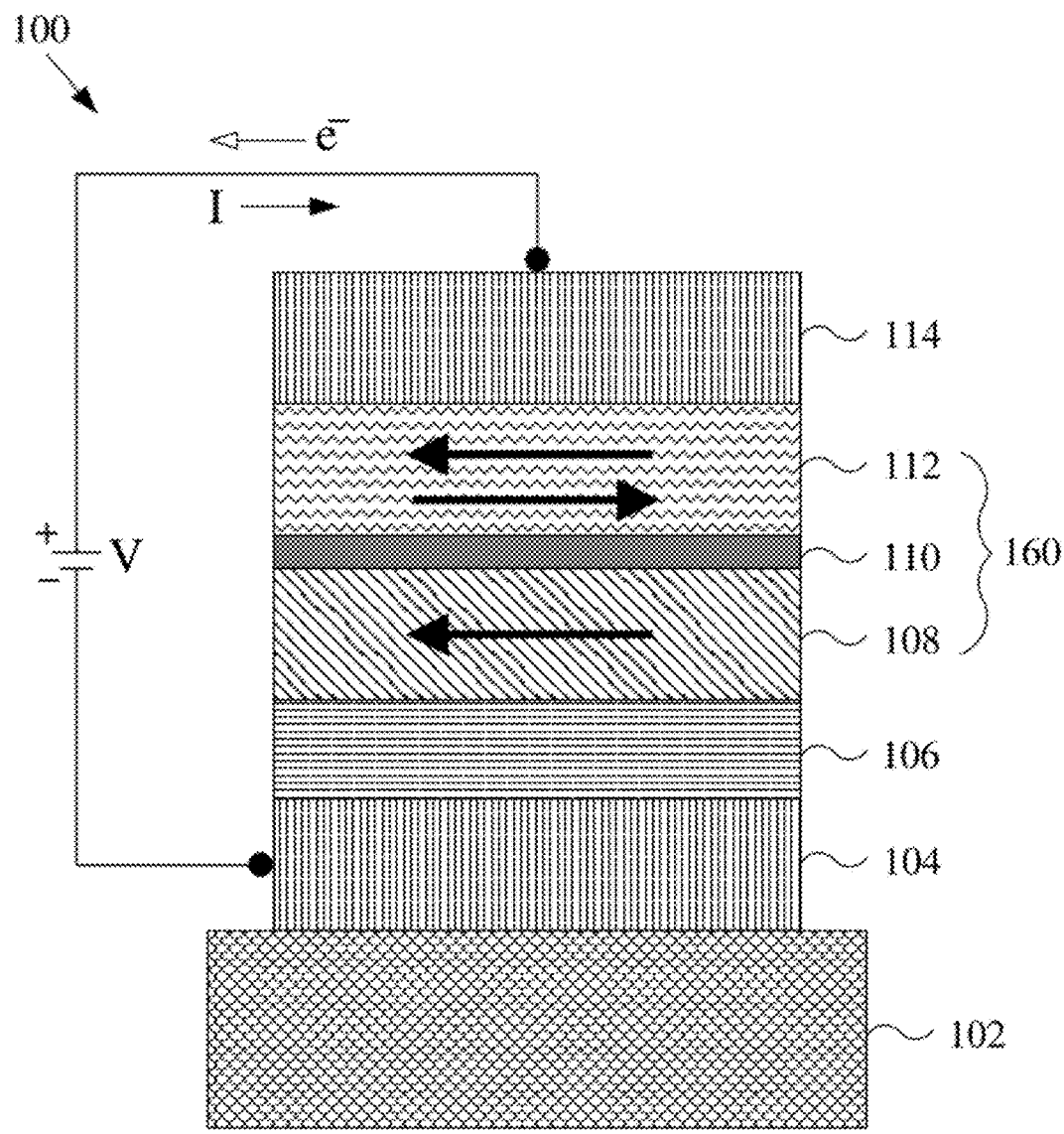
FIG. 2 is a schematic cross section view of the layers of a reconfigurable magnetic tunnel diode (RMTD) according to the present disclosure having electrical terminals.

FIG. 2 exemplarily shows a reconfigurable magnetic tunnel diode 100 according to the present disclosure preferably having a structure in form of a material layer stack with layers that are arranged over one another and/or firmly connected with each other. The tunnel diode 100 comprises an electrical insulating substrate layer 102, a thereon arranged bottom electrode 104 for electrical connecting the half metallic magnet 108 in particular to an external electrical circuit with the voltage V, a thereon arranged fixation layer 106 for fixing a magnetization direction of a layer adjacent to the fixation layer 106, a tunnel barrier junction 160 that comprises or consists of three layers, and/or an upper electrode 114, which is arranged on the tunnel junction 160, for electrical connecting a magnetic spin gapless semiconductor between the bottom electrode 104 and the upper electrode 114 and/or between the half metallic magnet 108.

The tunnel junction 160 comprises or consist of a half metallic magnet 108 generally with an excitation spin gap that preferably has a fixed magnetization direction due to the fixation layer 106, a tunnel barrier 110 arranged in the half metallic magnet 108 as insulator between the two layers adjacent to the tunnel barrier 110, and a spin gapless semiconductor 112 arranged on the tunnel barrier 110, whose magnetization direction is reconfigurable, i.e. re-switchable or reversible.

In one embodiment of the magnetic tunnel diode, the layers half metallic magnet 108 and spin gapless semiconductor 112 are interchanged, whereby the magnetization direction of the spin gapless semiconductor 112 is then fixed and the magnetization direction of the half metallic magnet is reconfigurable.

In one embodiment, the substrate 102 comprises or consists of MgO or $SiO_2$. A reliable function of the diode can thereby be assured.

In one embodiment, the bottom electrode 104 and/or the upper electrode 114 comprise or consist of Ti, Ru, Rh, Cu, N, Al, Ta, CuN or a combination of at least two of these materials, particularly in the form of a multilayer system. This ensures reliable functioning of the bottom and upper electrodes.

In particular, the upper electrode 104 and/or bottom electrode 114 have a planar expanding shape with a thickness of at least 10 nm and/or at most 100 nm, preferably at most 50 nm, particularly preferred at most 30 nm. A compact design and yet reliable function can be achieved.

In one embodiment, the fixation layer 106 comprises or consists of an anti-ferromagnetic material and/or a half metallic magnet, preferably FeMn, NiMn, PtMn, IrMn, PdMn, PtPdMn or RhMn. In principle, the fixation layer 106 can have a magnetization direction in the plane of the layer or at an angle to the plane of the layer, preferably 90°. In this way, it is possible to reliably fix or fixate the spin, i.e. the magnetization direction, in an adjacent magnetic layer, for example the half metallic magnet 108.

In particular, the fixation layer 106 has a planar expanding shape with a thickness of at least 10 nm and/or at most 100 nm, preferably at most 50 nm, particularly preferred at most 30 nm. A compact design and yet reliable function can be achieved.

In one embodiment, the half metallic magnet 108 and/or the spin gapless semiconductor 112 are composed such way that the magnetization direction or the magnetic moment can be fixed or fixated in the presence of a magnetic field, i.e. a reversal of the magnetization direction or the magnetic moment can be prevented by the presence of the magnetic field. In particular, for that purpose, the half metallic magnet 108 and/or the spin gapless semiconductor 112 are ferromagnetic or ferrimagnetic.

In one embodiment, the half metallic magnet 108 comprises or consists of a material with a Curie temperature above room temperature and/or with a large half metallic band gap such as e.g. half metallic full Heusler compounds such as $Co_2YZ$, where Y=Ti, V, Cr, Mn, Fe, and Z=Al, Ga, In, Si, Ge, Sn, As, Sb and inverse Heusler compounds having the chemical formula $X_2YZ$, where X=Sc, Ti, V, Cr, Mn and Z=Al, Si, As and Y=Ti to Zn, as well as semi-Heusler compounds XYSb, where X=Fe, Co, Ni and Y=Mn.

In particular, the half metallic magnet 108 has a planar expanding shape with a thickness of at least 1 nm, preferably 5 nm, particularly preferred 10 nm, and/or at most 50 nm, preferably at most 40 nm, particularly preferred at most 30 nm. A compact design and yet reliable function can be achieved.

In one embodiment, the tunnel barrier 110 comprises or consists of an insulating material, which in particular has a band gap of at least 0.4 eV, preferably MgO or $AlO_x$, but generally also $AlO_x$, MgAlO, $TaO_x$, $SiO_2$, $HfO_2$, intrinsic semiconductors like f. ex. Si, GaAs, and two-dimensional systems like f. ex. hexagonal BN. A reliable barrier function can thereby be assured.

In particular, the tunnel barrier 110 has a planar expanding shape with a thickness of at least 0.5 nm, preferably 1 nm, and/or at most 5 nm, preferably at most 4 nm, particularly preferred at most 2 nm. A reliable barrier function of the tunnel barrier 110 can thereby be enabled, wherein too thick layer thicknesses prevent the tunneling effect too strongly and even thinner layer thicknesses may break down in the electrical field.

In one embodiment, the spin gapless semiconductor 112 comprises or consists of a magnetic material, which in particular has a magnetization direction in layer plane or at an angle to the layer plane. Basically, the spin gapless semiconductor 112 is designed in such a way that the magnetization direction of the spin gapless semiconductor 112 can be configured in the presence of a magnetic field and also reconfigured during operation of the tunnel diode, i.e. reversed. This makes it possible to change the conduction direction of the current of the tunnel diode during operation.

Preferably, the spin gapless semiconductor 112 comprises or consists of a quaternary Heusler compounds such as f. ex. FeCrXZ, FeVXZ', and MnVXZ" compounds, where X=Ti, Zr, Hf, Z=Al, Ga, In, Z'=Si, Ge, Sn, and Z"=P, As, Sb. Generally, any material possessing spin gapless semiconducting properties preferably with Curie temperature above the room temperature can be considered for the spin gapless semiconductor layer 112.

In particular, the spin gapless semiconductor 112 has a planar expanding shape with a thickness of at least 1 nm, preferably 2 nm, and/or at most 40 nm, preferably at most 20 nm, particularly preferred at most 8 nm. A reliable reconfiguration can thereby be achieved, wherein when using thicker layers, at least a current induced spin transfer moment reconfiguration is eventually not any more possible to achieve. An optimal layer thickness for the spin gapless semiconductor 112 amounts to usually exactly or roughly 3 nm. The feasibility of manufacturing the spin gapless semiconductor 112 with reproducible properties and a reliable functioning of the tunnel diode can thereby be enabled.

In a first exemplary embodiment a magnetic tunnel diode 100 according to the present disclosure, which is schematically shown in FIG. 2, comprises a substrate 102 of MgO, a bottom electrode 104 of Ta with 20 nm layer thickness, a fixation layer 106 of IrMn with 10 nm layer thickness, a half metallic magnet 108 of $Co_2MnSi$ with 20 nm layer thickness, a tunnel barrier 110 of MgO with 1 nm layer thickness, a half metal without spin excitation gap 112 of FeVTiSi with 2 nm layer thickness and/or an upper electrode 114 of Ta with 20 nm layer thickness. The magnetic tunnel diode 100 structured in this way showed the functions non-volatility and reconfigurability of the passing direction as well as the inverse TMR effect.

A reconfiguration by current induced switching of the magnetization direction of the spin gapless half metallic layer 212 of FeVTiSi can be reached by applying a current (I, FIG. 2) greater than the operation current amounting to a critical current density $I_{cr}$ of about $10^7$ A/cm$^2$.

In a second exemplary embodiment a magnetic tunnel diode 100 according to the present disclosure, which is schematically shown in FIG. 2 under interchanging the layers 108 and 112, comprises a substrate 102 of MgO, arranged thereon a bottom electrode 104 of Ta with 20 nm layer thickness, arranged thereon a fixation layer 106 of IrMn with 10 nm layer thickness, arranged thereon a half metal without spin excitation gap of FeVTiSi with 8 nm layer thickness, arranged thereon a tunnel barrier 110 of MgO with 3 nm layer thickness, arranged thereon half metallic magnet of $Co_2FeAl$ with 30 nm layer thickness and/or arranged thereon an upper electrode 114 of Ta with 20 nm layer thickness. The magnetic tunnel diode 100 structured in this way showed the functions non-volatility and reconfigurability of the passing direction as well as the inverse TMR effect.

In a third exemplary embodiment a magnetic tunnel diode 100 according to the present disclosure, which is schematically shown in FIG. 2, comprises a substrate 102 of MgO, a bottom electrode 104 of Ta with 20 nm layer thickness, a fixation layer 106 of IrMn with 10 nm layer thickness, a half metallic magnet 108 of $Co_2FeAl_{0.5}Si_{0.5}$ with 10 nm layer thickness, a tunnel barrier 110 of MgO with 1 nm layer thickness, a half metal without spin excitation gap 112 of FeVZrGe with 2 nm layer thickness and/or an upper electrode 114 of Ta with 20 nm layer thickness. The magnetic tunnel diode 100 structured in this way also showed the functions non-volatility and reconfigurability of the passing direction as well as the inverse TMR effect.

One or all layers of the magnetic tunnel diode 100 of FIG. 2 can be produced by deposition processes or coating techniques such as magnetron sputtering, radiofrequency sputtering and/or electron beam evaporation.

In particular, at least two or all layers of the magnetic tunnel diode 100 of FIG. 2 are produced by successive deposition in an ultra-high vacuum chamber by applying magnetron sputtering and electron beam evaporation.

In the first exemplary embodiment, for example, the Ta layer was applied as later electrode at room temperature to an MgO substrate by magnetron sputtering and the IrMn layer was formed thereon as a solid layer at room temperature with magnetron sputtering. Onto the fixation layer, it was firstly deposited $Co_2MnSi$ by magnetron sputtering at room temperature and then annealed at about 500° C. to produce epitaxial growth of the $Co_2MnSi$ layer. Ideally, the $Co_2MnSi$ layer crystallizes in the cubic $L2_1$ type structure and the cell units then comprise four interpenetrating fcc subgrids with the positions (0, 0, 0, 0) and (0.5 0.5 0.5) for co-atoms, (0.25, 0.25, 0.25) for the Mn atom and (0.75, 0.75, 0.75, 0.75) for the Si atom.

The MgO tunnel barrier can then be created by deposition on the $Co_2MnSi$ layer, preferably by electron beam evaporation at room temperature. The FeVTiSi layer can also be applied at room temperature advantageously by magnetron sputtering with subsequent annealing, especially at about 500° C. to achieve epitaxial growth of the FeVTiSi layer on the underlying MgO tunnel barrier. Similar to the $Co_2MnSi$ layer, the FeVTiSi layer can thereby ideally crystallize into a cubic quaternary Heusler-type structure with the positions (0, 0, 0) for the Fe atom, (0.25, 0.25, 0.25) for the Ti atom, (0.5, 0.5, 0.5) for the V atom and (0.75, 0.75, 0.75) for the Si atom.

The TA layer can also preferably be deposited by magnetron sputtering as to form the later electrode.

The above described rectification properties of the tunnel diode are depending on the relative orientation of the magnetization directions of the magnetic layers 108 and 112. When the magnetization of the half metallic magnet 108 and the spin gapless semiconductor 112 are anti-parallel as in FIG. 3a, then the tunneling current is possible only in one direction, while in the other direction it is blocked; the tunnel junction 160 thus behaves like a diode. If the magnetization direction of the spin gapless semiconductor 112 is reversed, i.e. if it runs parallel to the half metallic magnet 108, then the rectification properties of the diode is also reversed as shown in FIG. 3b.

Figure 3A:
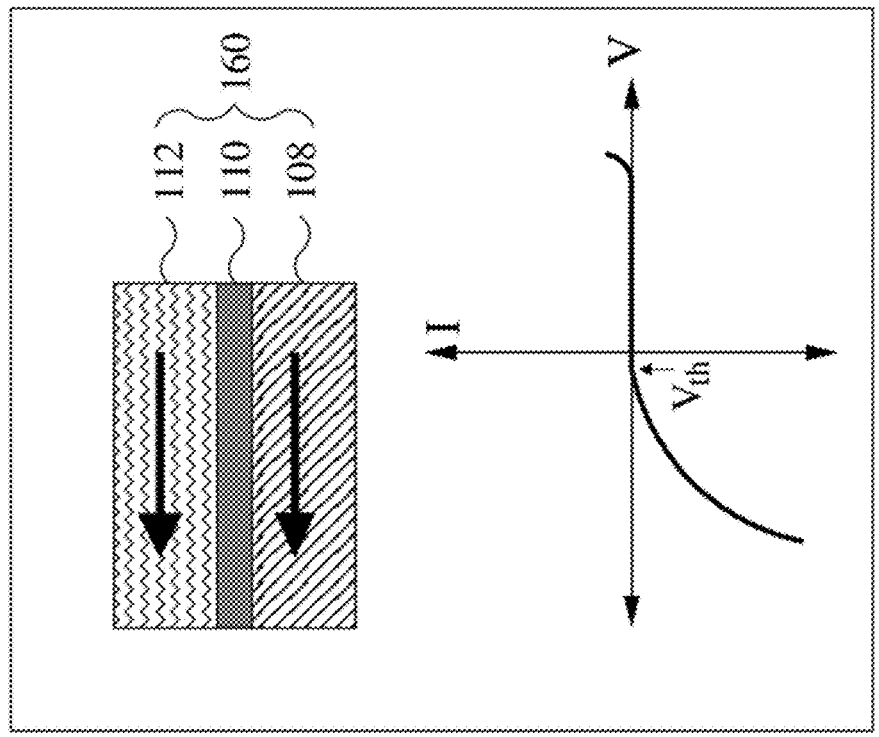
FIG. 3a is schematic representation of the antiparallel orientation of the magnetization directions of the corresponding current-voltage characteristics or I-V output signal function of the magnetic tunnel diode.

If, as shown in FIG. 3a, a positive voltage V or a positive voltage signal is present between the terminals of the diode, the diode only starts to conduct current from a critical voltage or threshold voltage $V_{th}$. After the threshold voltage, an exponential increase in current I above the voltage V occurs. If the current becomes too high, however, there is generally the risk of cracks in the diode and melting of the diode. In the case of negative voltages, no or almost no current I is conducted in the opposite direction. It should be noted that, in principle, very high negative voltages, particularly beyond a common operating range of the diode, can still cause a current flow.

Figure 3B:
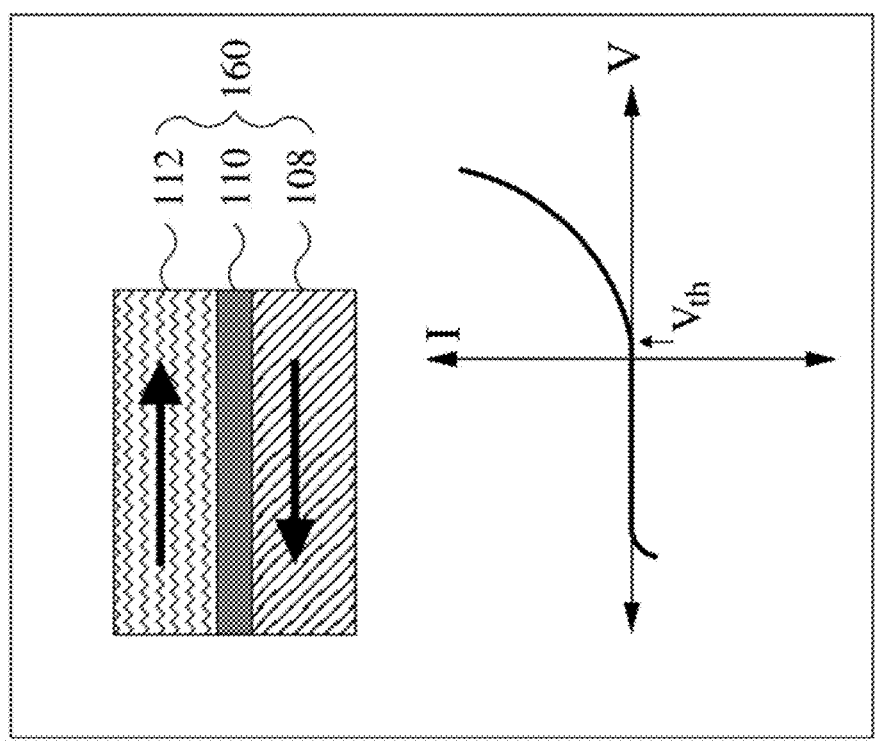
FIG. 3b is schematic representations of the parallel orientation of the magnetization directions of the corresponding current-voltage characteristics or I-V output signal function of the magnetic tunnel diode.

In one embodiment example, the tunnel diode is designed in such a way that when reversing the magnetization direction of the spin gapless semiconductor 112, then also the current-voltage curve (I-V) get reversed, i.e. mirrored in the voltage and current axis (cf. FIG. 3a, 3b). The diode can be configured in this way.

This means that the tunnel diode can be dynamically configured by an external magnetic field or by a spin-transfer torque mechanism.

In the tunnel diode of FIG. 2, the magnetization direction of the half metallic magnet 108 is fixed and the magnetization direction of the spin gapless semiconductor 112 is freely rotatable.

One advantageous effect of the tunnel diode according to the present disclosure is that the threshold voltage $V_{th}$, at which the diode allows the current to pass, depends on the thickness and potential height of the insulating barrier, and thus $V_{th}$ can be tuned by appropriate choice of these two parameters.

In semiconductor-based diodes, the threshold voltage $V_{th}$ is normally fixed, cannot be changed. For example, the threshold voltage $V_{th}$ is approximately 0.3 V for diodes made of or with germanium and approximately 0.7 V for diodes made of or with silicon.

As shown in FIG. 4, the bidirectional behavior of the tunnel diode can be explained by the density of states of the magnetic layer 108 and 112, i.e. the half metallic magnet 108 and the spin gapless semiconductor 112, under positive and negative bias voltage.

In the Simmons model, the tunneling current I(V) for the bias voltage V is given by the expression $$I(V) \sim |\sum_{\sigma} \int_{-\infty}^{\infty} \rho_{HMM}^{\sigma}(E) \rho_{SGS}^{\sigma}(E+eV) |T(V)|^2 f(E)[1-f(E+eV)]dE.$$

where $\rho_{HMM}^{\sigma}(E)$ and $\rho_{SGS}^{\sigma}(E+eV)$ denotes the density of states of both magnetic layers 108 and 112 with spin $\sigma$ and f(E) is the Fermi distribution function. T(V) is the transmission probability and is proportional to $e^{-d\sqrt{\phi-V}}$, where d is the thickness of the tunnel barrier 110 and $\phi$ being the barrier height.

As shown in FIG. 4b, electrons tunnel from the occupied majority-spin valence band of the half metallic magnet 108 through the insulating tunnel barrier 110 into the unoccupied minority-spin conductor band of the spin gapless semiconductor 112, if a positive bias voltage is applied to the bottom electrode 104 and thus to the spin gapless semiconductor 112. Tunneling of electrons for the other spin channel is not possible, since there are no states that are at the half metallic magnet 108 under the Fermi energy and at the spin gapless semiconductor 112 above the Fermi energy, unless the applied bias voltage is too high.

The dashed lines in FIG. 4 show the energy range of those electrons that are able to tunnel through the barrier. If a negative voltage is applied to the spin gapless semiconductor 112, this prevents the tunneling of the electrons to the half metallic magnet 108 and thus to the upper electrode 114 due to the unique band structure of the HMM-I-SGS tunnel junction 160. If the electrodes are magnetized in parallel, as shown in FIGS. 4a to 4c, an electron current flows in the opposite direction, i.e. from the bottom electrode 104 to the upper electrode 114. By this way, an HMM-I-SGS tunnel diode can be dynamically configured, i.e. a magnetic tunnel diode with a layer of half metallic magnet 108, there above the tunnel barrier 110 and there above a layer of spin gapless semiconductor 112.

In particular, this tunnel diode reveals the characteristic of an inverse tunnel magnetoresistance effect (TMR) or is designed to enable it. The TMR effect generally occurs in a tunnel contact, which comprises e.g. two ferromagnets separated by a thin insulator. If the insulator layer is thin enough, e.g. in the single-digit nanometer range, electrons can tunnel from the one ferromagnet to the other one through the insulator layer. The TMR effect is a quantum mechanical phenomenon that cannot be described by classical physics. In a tunnel junction, the magnetization direction of one of the ferromagnets can be switched or reversed by an external magnetic field or by induced current. If the magnetization directions are parallel oriented, it is more likely that electrons will tunnel through the insulator layer than with anti-parallel or opposite magnetization directions of the two ferromagnets. From this it follows that such a tunnel junction can generally be switched between two electrical resistance states: one with low and one with high resistance.

Figure 5:
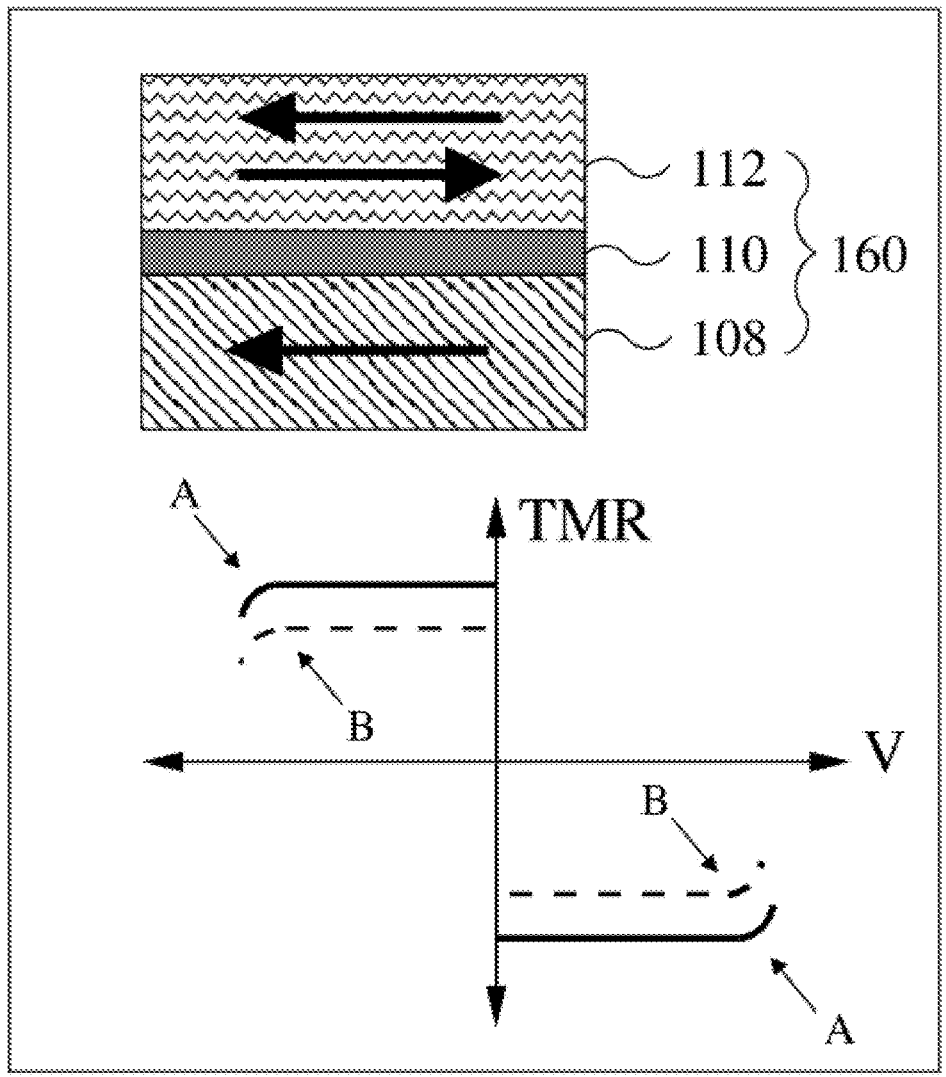
FIG. 5 is a schematic representation of the bias voltage dependence of the tunnel magnetoresistance (TMR) effect of the reconfigurable magnetic tunnel diode of FIG. 2.

FIG. 5 shows the TMR effect dependency for two cases: Labeled with "A" is the voltage dependency of the TMR value for a tunnel diode 100 with a tunnel junction 160 comprising a half metallic magnet 108 with fixed magnetization direction and the spin gapless semiconductor 112 with free magnetization direction. Labeled with "B" is the voltage dependency of the TMR value for a tunnel diode 100 with a tunnel contact 160 comprising a normal ferromagnetic or ferrimagnetic material as magnetic layer 108 with a fixed magnetization direction and the spin gapless semiconductor 112 with a free magnetization direction. TMR is defined by the formula $$TMR = \frac{R^{AP} - R^P}{R^{AP} + R^P} \times 100,$$

where $R^{AP}$ and $R^P$ are the resistors of the tunnel junctions for anti-parallel and parallel orientation of the magnetization of the magnetic layers 108 and 112. Due to the above described unique energy band structure of the HMM-I-SGS tunnel junction 160 with and without excitation gap (FIGS. 1a and 1b), the reconfigurable magnetic tunnel diode has the inverse TMR effect, i.e. the TMR changes the sign when the polarity of the applied bias voltage changes. As mentioned above, this is a very important property that allows the use of the reconfigurable magnetic tunnel diode to produce magnetic logic gates for e.g. computer processors.

Figure 6:
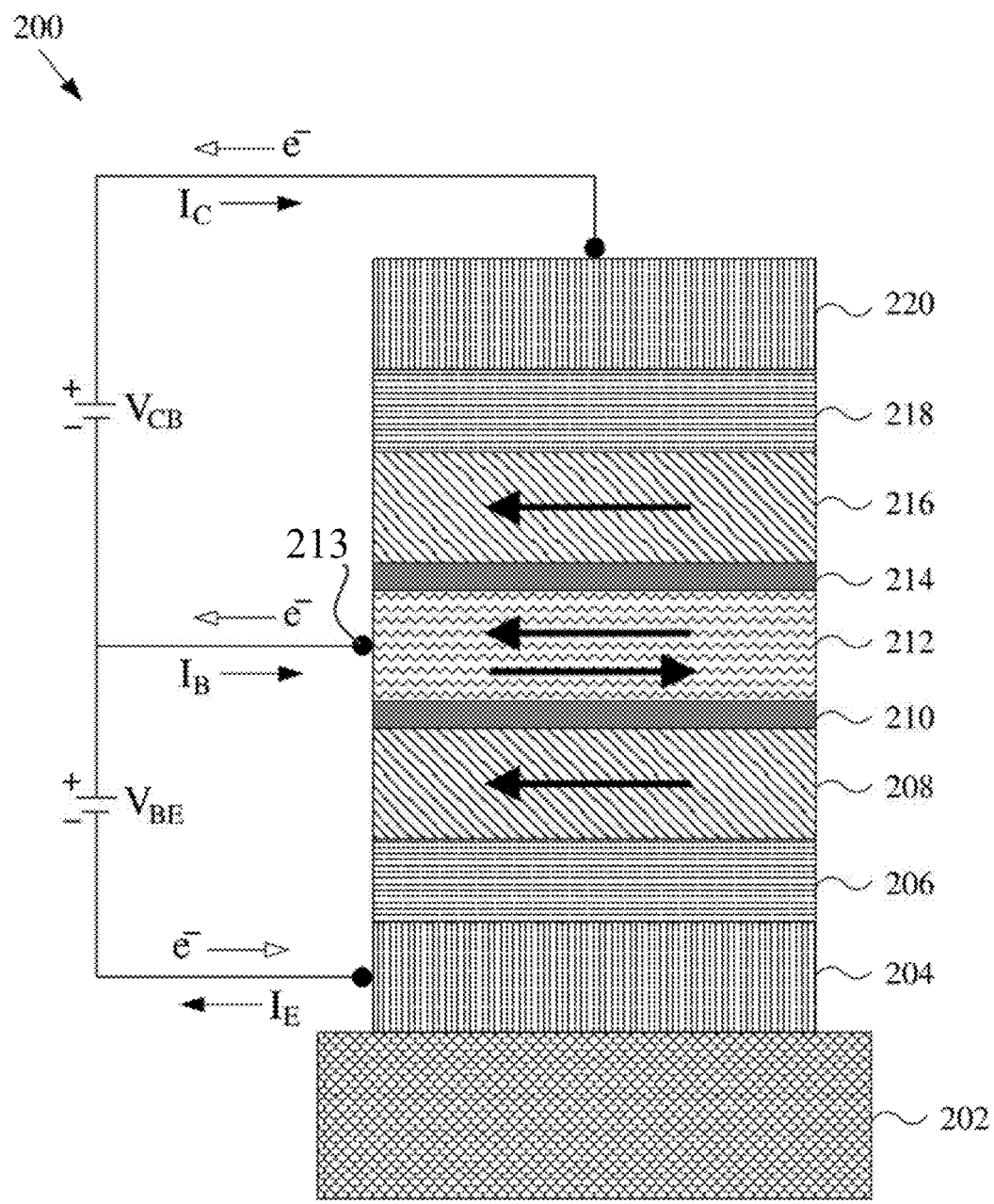
FIG. 6 is a schematic cross section view of a reconfigurable magnetic tunnel transistor (RMTT) according to the present disclosure having electrical terminals.

Since the HMM-I-SGS tunnel contact 160 is basically also present in the magnetic tunnel transistor 200 of FIG. 6, the magnetic tunnel transistor 200 also exhibits the inverse TMR effect.

If a normal ferromagnet such as Fe, Co, CoFe, or CoFeB is used in the tunnel junction 160 as a magnetic layer 108 with fixed magnetization direction instead of a half metallic magnet, the reconfigurable magnetic tunnel diode from FIG. 2 would loose the rectification characteristic described above and the inverse TMR effect would remain at least with reduced values. Due to the unique band structure described above, the spin gapless semiconductor 112 plays an important role for tunnel junction 160 in respect to the inverse TMR effect.

A transistor is basically an electronic component with three terminals that is used to amplify and/or switch electrical energy, preferably electronic signals. A voltage or current applied, which is applied to a pair of terminals of the transistor, can change, e.g. amplify, the current flow through another pair of terminals—wherein one of the terminals may be comprised by both pairs. A transistor is therefore a basic component of an integrated circuit or an electrical component.

A terminal is usually an electrode.

FIG. 6 shows a cross-section through the material layers of a reconfigurable magnetic tunnel transistor 200 together with connected external electrical circuits for applying a voltage $V_{CB}$ between a collector electrode 220 and a base electrode 213 as well as a voltage $V_{BE}$ between the base electrode 213 and the emitter electrode 204.

The reconfigurable magnetic tunnel transistor 200 comprises or consists of an insulating substrate layer 202, an emitter electrode 204, an in particular anti-ferromagnetic emitter fixation layer 206, an emitter half metallic magnetic layer 208, an emitter-base tunnel barrier 210, a spin gapless semiconductor layer 212, a base-collector tunnel barrier 214, a collector half metallic magnetic layer 216, a collector fixation layer 218 and/or a collector electrode 220. The base electrode 213 is connected to the spin gapless semiconductor layer 212 in an electrically conductive manner.

In particular, the reconfigurable magnetic tunnel transistor 200 according to the present disclosure does not, unlike the reconfigurable magnetic tunnel diode 100, allow interchanging of the spin gapless semiconductor layer 212 with the emitter half metallic magnetic layer 208 and/or the collector half metallic magnetic layer 216.

Basically, the reconfigurable magnetic tunnel transistor 200 according to the present disclosure therefore provides the spin gapless semiconductor layer 212 exactly and/or directly between the emitter-base tunnel barrier 210 and the base-collector tunnel barrier 214.

In particular, the substrate layer 202 comprise or consists of MgO or $SiO_2$. The emitter electrode 204 and/or the collector electrode 220 comprise or consist of Ti, Ru, Rh, Cu, N, Al, Ta, CuN or a combination of at least two of these materials, particularly in the form of a multilayer system. A reliable function of the electrodes can thus be ensured.

In particular, the emitter electrode 204 and/or the collector electrode 220 have a layer thickness of at least 10 nm and/or at most 100 nm, preferably at most 50 nm, particularly preferred at most 30 nm. A compact design and yet reliable function can be achieved.

In one embodiment, the emitter fixation layer 206 and/or the collector fixation layer 218 comprise or consist of an anti-ferromagnetic material and/or a half metallic magnet, preferably FeMn, NiMn, PtMn, IrMn, PdMn, PtPdMn or RhMn. Basically, the emitter fixation layer 206 and/or the collector fixation layer 218 can have a magnetization direction in layer plane or at an angle to the layer plane, preferably 90°. Reliable detection or fixation of the magnetization direction of the adjacent emitter or collector half metallic magnetic layer 208, 216 can thus be made possible.

In particular, the emitter fixation layer 206 and/or the collector fixation layer 218 have thicknesses of at least 10 nm and/or at most 100 nm, preferably at most 50 nm, and particularly preferred at most 30 nm. A compact design and yet reliable function can be achieved.

In one embodiment, only the emitter half metallic magnetic layer 208 and/or the collector half metallic magnetic layer 216 are designed in such a way that the magnetization direction can be fixed or fixated in the presence of a magnetic field, in particular by means of the emitter fixation layer 206 or the collector fixation layer 218. Preferably, the emitter half metallic magnetic layer 208 and/or the collector half metallic magnetic layer 216 are ferromagnetic or ferrimagnetic and/or comprise or consist of a material with a Curie temperature above room temperature and/or with a large half metallic band gap such as e.g. half metallic full Heusler compounds such as $Co_2YZ$, where Y=Ti, V, Cr, Mn, Fe, and Z=Al, Ga, In, Si, Ge, Sn, As, Sb and inverse Heusler compounds having the chemical formula $X_2YZ$, where X=Sc, Ti, V, Cr, Mn and Z=Al, Si, As and Y=Ti to Zn, as well as half Heusler compounds XYSb, wherein X=Fe, Co, NI and Y=Mn.

In particular, the emitter half metallic magnetic layer 208 and/or the collector half metallic magnetic layer 216 have layer thicknesses of at least 1 nm, preferably 5 nm, particularly preferred 10 nm, and/or at most 50 nm, preferably at most 40 nm, particularly preferred at most 30 nm. A compact design and yet reliable function can be achieved.

In one embodiment, the emitter-base tunnel barrier 210 and/or the base-collector-tunnel barrier 214 comprise or consist of an insulator material, which has in particular a band gap of at least 0.4 eV, preferably MgO or $AlO_x$, but in principle also $AlO_x$, MgAlO, $TaO_x$, $SiO_2$, $HfO_2$, intrinsic semiconductors such as e.g. Si, GaAs, and two-dimensional systems such as hexagonal BN. A tunnel transistor with particularly low leakage current can thus be provided.

In particular, the emitter-base tunnel barrier 210 and/or the base-collector tunnel barrier 214 have a layer thickness of at least 0.5 nm, preferably 1 nm, and/or at most 5 nm, preferably at most 4 nm, particularly preferred at most 2 nm. A reliable barrier function can thus be enabled, wherein too thick layer thicknesses hinder the tunneling effect too strongly and even thinner layer thicknesses may break down in the electrical field.

In one embodiment, the spin gapless semiconductor 212 comprises or consists of a magnetic material, which in particular has a magnetization direction in layer plane or at an angle to the layer plane. Basically, the spin gapless semiconductor 212 is designed in such a way that the magnetization direction of the spin gapless semiconductor 112 can be configured in the presence of a magnetic field and reconfigured also during operation of the tunnel transistor. This makes it possible to change the current direction of the tunnel transistor during operation.

Preferably, the spin gapless semiconductor 112 comprises or consists of a quaternary Heusler compounds such as e.g FeCrXZ, FeVXZ', and MnVXZ" compounds wherein X=Ti, Zr or Hf, Z=Al, Ga, In, B or TI, Z'=Si, Ge, Sn, C or Pb, and Z"=P, As, Sb, N or Bi. Generally, any material possessing spin gapless semiconducting properties preferably with Curie temperature above the room temperature can be considered for the spin gapless semiconductor layer 112.

In particular, the spin gapless semiconductor layer 212 has a thickness of at least 1 nm, preferably 2 nm, and/or at most 40 nm, preferably at most 20 nm, especially at most 8 nm. Reliable reconfiguration can thus be made possible, whereas with thicker layers at least current-induced spin transfer torque reconfiguration can no longer be achieved. An optimal layer thickness for the spin gapless semiconductor layer 212 is regularly exactly or approximately 3 nm. This makes it possible to produce the spin gapless semiconductor layer 212 with reproducible properties and a reliable function of the tunnel transistor is thus enabled.

In a first exemplary embodiment, a magnetic tunnel transistor 200 according to the present disclosure, which is schematically illustrated in FIG. 6, comprises a substrate layer 202 of MgO, a emitter electrode 204 of Ta with 20 nm layer thickness, an emitter fixation layer 206 of IrMn with 10 nm layer thickness, an emitter half metallic magnetic layer 208 of $Co_2MnSi$ with 20 nm layer thickness, an emitter-base tunnel barrier 210 of MgO with 1 nm layer thickness, a half metallic layer without excitation gap 212 of FeVTiSi with 2 nm layer thickness, a base-collector tunnel barrier 214 of MgO with 1 nm layer thickness, a collector half metallic magnet layer 216 of $Co_2MnSi$ with 20 nm layer thickness, a collector fixation layer 218 of IrMn with 10 nm layer thickness and/or a collector electrode 220 of Ta with 20 nm layer thickness. The magnetic tunnel transistor 200 structured this way revealed the function non-volatility and reconfigurability of the passing direction.

A reconfiguration by current inducted switching of the magnetization direction of the spin gapless half metallic layer 212 of FeVTiSi can be reached by applying a current between emitter and base ($I_B$) and/or between collector and base ($I_E$) greater than the operation current amounting to a critical current density $I_{cr}$ of about $10^7$ A/cm$^2$ (FIG. 6).

In a second exemplary embodiment, a magnetic tunnel transistor 200 according to the present disclosure, which is schematically illustrated in FIG. 6, comprises a substrate layer 202 of MgO, a emitter electrode 204 of Ta with 20 nm layer thickness, an emitter fixation layer 206 of IrMn with 10 nm layer thickness, an emitter half metallic magnetic layer 208 of Co$_2$FeAl with 30 nm layer thickness, an emitter-base tunnel barrier 210 of MgO with 3 nm layer thickness, a half metallic layer without excitation gap 212 of FeVZrSi with 8 nm layer thickness, a base-collector tunnel barrier 214 of MgO with 2 nm layer thickness, a collector half metallic magnet layer 216 of Co$_2$FeAl with 30 nm layer thickness, a collector fixation layer 218 of IrMn with 10 nm layer thickness and/or a collector electrode 220 of Ta with 20 nm layer thickness. The magnetic tunnel transistor 200 structured this way revealed the function non-volatility and reconfigurability of the passing direction.

In a third exemplary embodiment, a magnetic tunnel transistor 200 according to the present disclosure, which is schematically illustrated in FIG. 6, comprises a substrate layer 202 of MgO, a emitter electrode 204 of Ta with 20 nm layer thickness, an emitter fixation layer 206 of IrMn with 10 nm layer thickness, an emitter half metallic magnetic layer 208 of Co$_2$FeAl$_{0.5}$Si$_{0.5}$ with 10 nm layer thickness, an emitter-base tunnel barrier 210 of MgO with 3 nm layer thickness, a half metallic layer without excitation gap 212 of FeVZrSi with 2 nm layer thickness, a base-collector tunnel barrier 214 of MgO with 2 nm layer thickness, a collector half metallic magnet layer 216 of Co$_2$FeAl$_{0.5}$Si$_{0.5}$ with 10 nm layer thickness, a collector fixation layer 218 of IrMn with 10 nm layer thickness and/or a collector electrode 220 of Ta with 20 nm layer thickness. The magnetic tunnel transistor 200 structured this way revealed the function non-volatility and reconfigurability of the passing direction.

One or all layers of the magnetic tunnel transistor 200 of FIG. 2 can be produced by deposition processes or coating techniques such as magnetron sputtering, radiofrequency sputtering and/or electron beam evaporation. The same manufacturing steps can be used here as described above for the first exemplary embodiment example of the magnetic tunnel diode 100.

In one embodiment, the collector half metallic magnetic layer 216 is made of the same material as the emitter half metallic magnetic layer 208. A reduced manufacturing effort for the tunnel transistor can thus enabled.

In one embodiment, the base-collector tunnel barrier 214 consists of the same material as the emitter-base tunnel barrier 210. A reduced manufacturing effort for the tunnel transistor can thus achieved.

In one embodiment, the emitter fixation layer 206 consists of the same material like the collector fixation layer 218 A reduced manufacturing effort for the tunnel transistor can thus enabled.

In one embodiment, the magnetic tunnel transistor 200 has a symmetrical structure in cross section from the base-collector tunnel barrier 214 to the emitter-base tunnel barrier 210, in particular with the same layer thicknesses of the layers arranged between the base-collector tunnel barrier 214 and the emitter-base tunnel barrier 210. A particularly homogeneous mode of operation and reliability can thus be achieved.

In one embodiment, the magnetic layers are 108, 208 and/or 216 have layer thicknesses of at least 1 nm and/or 40 nm at most.

In one embodiment, the magnetic layers 112 and/or 212 have layer thicknesses of at least 1 nm and/or at most 40 nm.

In one embodiment, in cross section, the magnetic tunnel transistor 200 has a symmetrical structure from the collector half metallic magnetic layer 216 to the emitter half metallic magnetic layer, in particular with the same layer thickness of the layers arranged between the collector half metallic magnetic layer 216 and the emitter half metallic magnetic layer. A particularly homogeneous mode of operation and reliability can thus be achieved.

In one embodiment, in cross section, the magnetic tunnel transistor 200 has a symmetrical structure from the emitter fixation layer 206 to the collector fixation layer 218, in particular with same layer thicknesses as the layers arranged between the emitter fixation layer 206 and the collector fixation layer 218. A particularly homogeneous mode of operation and reliability can thus be achieved.

Figure 7:
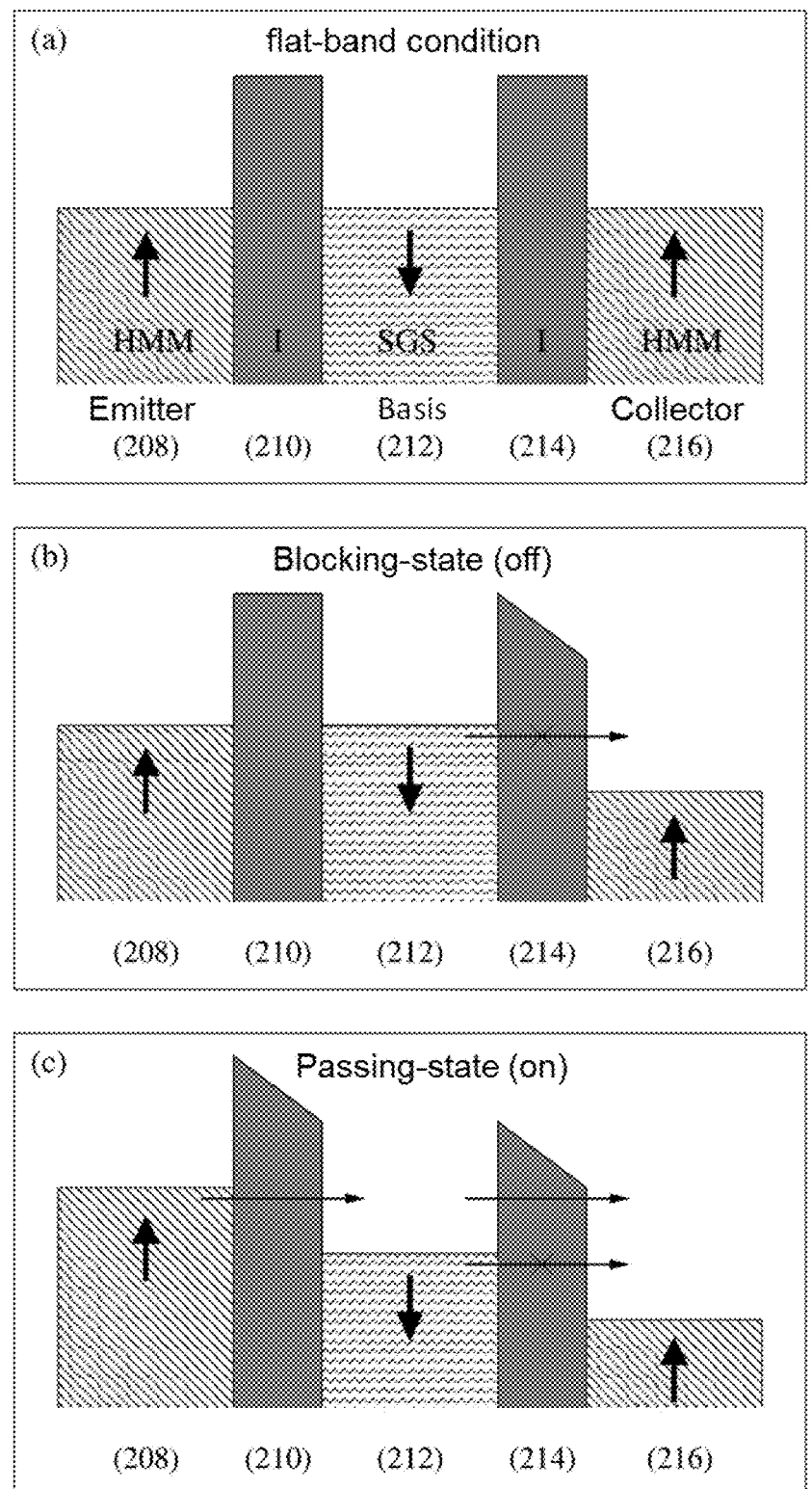
FIG. 7a is a schematic band diagram of a reconfigurable magnetic tunnel transistor according to the present disclosure in a modes of operation associated with band alignment under the flat-band condition.
FIG. 7b is a schematic band diagram of a reconfigurable magnetic tunnel transistor according to the present disclosure in a modes of operation associated with the blocking-state.
FIG. 7c is a schematic band diagram of a reconfigurable magnetic tunnel transistor according to the present disclosure in a modes of operation associated with the passing-state.

FIG. 7 shows a schematic energy band diagram of the reconfigurable magnetic tunnel transistor 200 in different modes of operation. The magnetization direction of the emitter half metallic magnetic layer 208 and the collector half metallic magnetic layer 216 are parallel aligned and compared to that, the half metallic layer without spin excitation gap 212 has an opposite magnetization, as the arrows in FIGS. 7a to 7c show.

Without a voltage drop across the emitter-base tunnel barrier 210, i.e. VBE=0, the transistor is in the blocking-state, regardless of any positive bias voltage applied to the collector electrode 220. In the blocking-state, no or at least a negligibly low current flows from the emitter, i.e. the emitter half metallic magnetic layer 208, to the collector, i.e. the collector half metallic magnetic layer 216. Furthermore, the above described unique band structure of the spin gapless semiconductor layer 212 prevents the flow of a base-collector leakage current.

This offers a particular advantage over conventional hot carrier tunnel transistors in which thick base-collector tunnel barriers are used to reduce a current flow from the emitter to the collector, but which lead to low transfer rates α.

In the magnetic tunnel diode 200 shown in FIG. 6, the following effect can be observed. When a finite positive blocking voltage is applied to the spin gapless semiconductor layer 212 via the base electrode 213 and to the collector half metallic magnetic layer 216 via the collector electrode 220 ($V_{CB}$>0), hot electrons with high kinetic energy can flow from the emitter to the base, thus to the spin gapless semiconductor, by tunneling through the insulating emitter-base tunnel barrier 210. The flowing hot electrons pass through the base zone or the spin gapless semiconductor 212, respectively, whereby some of the electrons retain their high energy and reach the collector. The state of the reconfigurable magnetic tunnel transistor can therefore be controlled by applying a voltage to the base electrode 213.

A special advantage of the magnetic tunnel transistor 200 according to the present disclosure is that it can conduct current in both directions, similar to conventional MOSFETs. Conventional hot carrier tunnel transistors cannot conduct current in both directions.

FIG. 8b illustrates the mechanism that can prevent leakage currents, i.e. an electron flow from the base to the collector, or at least reduce them to a negligible extent in the magnetic tunnel transistor 200 according to the present disclosure. In the state, shown in FIG. 8b, of the transistor, a finite bias voltage ($V_{CB}>0$) is applied to the collector electrode 220, which is normally continuously the case in operation. Due to the fact that there is no voltage on the collector ($V_{BE}=0$), the magnetic tunnel transistor 200 is in the blocking state. The existence of the blocking-state without or almost without an electron flow to the collector is due to the fact that in the collector half metallic magnetic layer 216, there are no states above the Fermi energy for minority-spin electrons and thus tunneling of hot electrons, i.e. energetically excited electrons, of the minority-spin valence band of the base that is occupied below the Fermi energy can be prevented or at least counteracted despite the voltage $V_{CB}>0$ to the collector.

The spin excitation gap $G_{VB}$ (see FIG. 1) of the collector, i.e. the distance between the Fermi energy and the minority-spin valence band, determines the maximum collector voltage at which the base-collector leakage current can be prevented or almost prevented. In particular, this value is less than 1 eV for the half metallic magnetic materials of the emitter half metallic magnetic layer 208 and/or the collector half metallic magnetic layer 216 used here. An electron tunneling from the base to the collector can thus be counteracted particularly successfully.

FIG. 8c now illustrates the mechanism that allows an electron flow from the emitter to the collector, specifically via the base, i.e. with a temporary presence in the base or a crossing of the base. If a positive bias voltage ($V_{BE}>0$) is applied to the base electrode 213 and a positive bias voltage ($V_{CB}>0$) is also applied to the collector electrode 220—which is the standard case—, hot electrons can tunnel from the emitter through the insulating emitter-base tunnel barrier 210 to the base, as the electron structure of the HMM-I-SGS tunnel junction 160 of the magnetic tunnel transistor 200—thus emitter half metallic magnet layer 208, emitter-base tunnel barrier 210 and spin gapless semiconductor 212—does allow this tunneling process. Because hot electrons of the occupied majority-spin band of the emitter below the Fermi energy on the left hand side of the vertical axis can migrate to the unoccupied majority-spin band of the base above the Fermi energy on the left hand side of the vertical axis.

Some of these hot electrons, which have reached in this way in the base zone, can then, depending on their energy, immediately tunnel further to the collector and overcome the base-collector tunnel barrier 214, as also here the HMM-I-SGS tunnel junction 160 of the magnetic tunnel transistor 200—thus spin gapless semiconductor layer 212, base-collector tunnel barrier 214, collector half metallic magnet layer 2016—does allow this tunneling process. Because the majority-spin band of the collector above the Fermi energy and on the left hand side of the vertical axis is unoccupied. Some of these electrons are thermalized in the base and generate the base current $I_B$. The emitter current $I_E$ is the sum of base current and collector current: $I_E=I_B+I_C$.

However, as described above in respect to FIG. 8b, electrons from the occupied minority-spin band below the Fermi energy on the right-hand side of the vertical axis still cannot or almost cannot migrate or tunnel from the base to the collector, because the collector has no reachable minority-spin band on the right-hand side of the vertical axis in the Fermi energy range. This is because there is the band gap $G_{VB}$, $G_{CB}$.

This makes it possible to allow to selecting, for the magnetic tunnel transistor 200 according to the present disclosure and the magnetic tunnel diode 100 according to the present disclosure, the thickness and height of the tunnel barriers 210, 216 or of the tunnel barrier 110, respectively, as small as possible in order to increase the performance of the components, since the tunnel current exponentially increases with decreasing barrier thickness and height.

The magnetic tunnel transistor 200 according to the present disclosure allows, like the magnetic tunnel diode 100 according to the present disclosure, to be configured by switching the magnetization direction of the spin gapless semiconductor layer 212.

This can be achieved either by applying an external magnetic field or by means of a current-induced spin transfer torque mechanism—also called current-induced magnetic switching. For this purpose, a current greater than the operating current is applied.

FIG. 9a shows the spin distinguished electron band structure of the spin gapless semiconductor layer 212 made of a FeVZrSi alloy along the highly symmetrical lines in the Brillouin zone. The solid lines show the band structure of the majority-spin electrons.

The dashed lines show the band structure of the minority-spin electrons. The values on the vertical axis are given in such a way that the Fermi energy is 0 eV and is drawn as dashed horizontal. As can be seen in FIG. 9a, the valence band of the majority-spin electrons adjoins the Fermi energy at the Γ-point (marked by a circle).

The lowest conduction band of the minority-spin electrons borders on the Fermi energy at a point between the points K and Γ (also marked by a circle). Consequently, the valence band of the majority-spin electrons and the conduction band of the minority-spin electrons have no indirect spin excitation gap. The evaluation of the FeVZrSi alloy thus verified the existence of a spin gapless semiconductor and was therefore used in the second embodiment example of a magnetic tunnel diode according to the present disclosure as spin gapless semiconductor 112 as well as in the second embodiment example of magnetic tunnel transistor according to the present disclosure as spin gapless semiconductor layer 212.

FIG. 9b illustrates the presence of a spin gapless semiconductor by means of the DOS representation in analogy to FIG. 1. The majority-spin band, which is on the left side of the vertical axis below the Fermi energy that is drawn as dashed horizontal line, borders at the intersection point of the vertical axis with the Fermi energy on the minority band, which is on the right side of the vertical axis above the Fermi energy.

The density of states diagram (DOS) of FIG. 9b that distinguishes between spins was calculated from the integral over all K-points in the entire Brillouin zone in a certain energy range (here: −6 eV to 4 eV) of FIG. 9a. The band structure and density of states in FIGS. 9a and 9b were calculated using the density functional theory within the generalized gradient approximation for the exchange-correlation functional with a dense k-point mesh of 20×20×20.

Concrete applications for the tunnel diode according to the present disclosure and the tunnel transistor according to the present disclosure include a magnetic field sensor, a storage element e.g. in an STT-MRAM, a module with logic gate or spin logic gate and a switch.

In particular, the material layer of the spin gapless semiconductor 112 comprises FeCrXZ, FeVXZ' and/or MnVXZ", where X=Ti, Zr or Hf, Z=B, Al, Ga or In, Z'=C, Si, Ge, Sn and Z"=N, P, As or Sb. This applies in particular to the magnetic tunnel diode 100 and/or the magnetic tunnel transistor 200.

The half metallic magnet 108 and the spin gapless semiconductor 112 of the magnetic tunnel diode (FIG. 2) and/or the magnetic tunnel transistor (FIG. 6) do not necessarily have to show the three-dimensional compounds or mixtures of substances given in the above examples. There are a number of atomically thin two-dimensional materials which have half metallic magnet properties, thus are half magnetic, and/or semiconductor properties without a spin excitation gap, thus a spin gapless semiconductor. Examples of this, especially compounds with semiconductor properties without a spin excitation gap, are hydrogenated graphene, $VX_2$ and/or $NbX_2$ (X=O, S, Se, Te). The thickness of these in particular two-dimensional half metallic magnets and/or spin gapless semiconductors is in particular at least 0.1 nm or at least 1 nm and/or at most 2 nm.

In particular, the magnetic tunnel diode 100 and/or the magnetic tunnel transistor 200 comprise a layer thickness of the material layer of the half metallic magnet (108) of at least 0.1 nm.

In particular, the magnetic tunnel diode 100 and/or the magnetic tunnel transistor 200 comprise a layer thickness of the material layer of the spin gapless semiconductor (112) of at least 0.1 nm.

In particular, the material layer of the spin gapless semiconductor (112) comprises or consists of a material, which has a thickness of only one atomic layer, which is substantially two-dimensional, i.e. having a two-dimensional structure, and/or which is as thin as an atom. This applies in particular to the magnetic tunnel diode 100 and/or the magnetic tunnel transistor 200.

In particular, the material layer of the spin gapless semiconductor (112) comprises or consists of hydrogenated graphene, $VX_2$ and/or $NbX_2$, where X=O, S, Se, Te.

In the aspect of the present disclosure concerning the method for configuring and/or reconfiguring the current passing direction of the magnetic tunnel diode and/or the magnetic tunnel transistor, in which in order to reverse the magnetization direction of the spin gapless semiconductor of the tunnel diode, the half metallic magnet of the tunnel diode and/or the spin gapless semiconductor layer of the tunnel transistor, a current greater than the operating current is applied or an external magnetic field is activated, the operating current is determined as following:

Operating current is equal to the current density multiplied by the cross-sectional area of the diode or transistor. The operating current can be symbolized with "I".

Cross-sectional area means the area extending orthogonally to the current flow direction. Current flow direction is the direction of the current for configuring and/or reconfiguring the current passage direction of the magnetic tunnel diode and/or the magnetic tunnel transistor.

In the FIGS. 2 and 6 the current flow direction is vertical and the cross-sectional area extends horizontally and in viewing direction.

In particular, the cross-sectional area is defined by the product of length and width, where the length and/or width are at least 5 nm, preferably at least 50 nm, and/or at most 200 nm, preferably at most 150 nm.

In particular, the length and width are 100 nm and the cross-sectional area is 10000 nm, preferably at a tunnel passage.

The current density is in particular at least $10^7$ A/cm$^2$.

In one embodiment, the operating current is $10^7$ A/cm$^2$× 100 nm×100 nm×100 nm=$10^{-3}$ A.

The invention claimed is:

1. A magnetic tunnel diode comprising two terminals for connecting to an electrical circuit as well as a tunnel junction having a material layer of a half metallic magnet, a tunnel barrier, and a material layer of a spin gapless semiconductor.

2. The magnetic tunnel diode of claim 1, wherein the material layer of the half metallic magnet has a fixed magnetization direction and the material layer of the spin gapless semiconductor has a reconfigurable magnetization direction, or vice versa.

3. The magnetic tunnel diode of claim 1, wherein a fixation layer, which is adjacent to the tunnel junction, for fixing the magnetization direction either of the material layer of the half metallic magnet or of the material layer of the spin gapless semiconductor.

4. The magnetic tunnel diode of claim 1, wherein a layer thickness of the material layer of the half metallic magnet amounting to at least 0.1 nm.

5. The magnetic tunnel diode of claim 1, wherein a layer thickness of the material layer of the spin gapless semiconductor amounting to at least 0.1 nm.

6. The magnetic tunnel diode of claim 1, wherein the material layer of the spin gapless semiconductor comprises at least one of FeCrXZ, FeVXZ' and MnVXZ".

7. The magnetic tunnel diode of claim 1, wherein the material layer of the spin gapless semiconductor comprises at least one of FeVTiSi, FeVZrSi and FeVZrGe.

8. The magnetic tunnel diode of claim 1, wherein the material layer of the spin gapless semiconductor comprises material with a thickness of only one atomic layer.

9. The magnetic tunnel diode of claim 1, wherein the material layer of the spin gapless semiconductor comprises hydrated graphene, $VX_2$ and/or $NbX_2$, wherein X is one of O, S, Se, and Te.

10. The magnetic tunnel diode of claim 1, wherein a layer thickness of the material layer of the half metallic magnet amounting to at most 40 nm.

11. The magnetic tunnel diode of claim 1, wherein a layer thickness of the material layer of the spin gapless semiconductor amounting to at most 20 nm.

12. A magnetic tunnel transistor comprising three terminals, for connecting to an electrical circuit as well as a layer arrangement, the magnetic tunnel transistor comprising an emitter half metallic magnetic layer, an emitter-base tunnel barrier, a spin gapless semiconductor layer, a base-collector tunnel barrier and a collector half metallic magnetic layer.

13. The magnetic tunnel transistor of claim 12, wherein the layer arrangement is ordered: the emitter half metallic magnetic layer, the spin gapless semiconductor layer, and the collector half metallic magnetic layer.

14. A method for configuring a current passing direction of a magnetic tunnel diode including two terminals for connecting to an electrical circuit as well as a tunnel junction having a material layer of a half metallic magnet, a tunnel barrier, and a material layer of a spin gapless semiconductor, wherein in order to reverse the magnetization direction of at least one of the spin gapless semiconductor and the half metallic magnet, a current greater than an operating current is applied or an external magnetic field is activated.

* * * * *